United States Patent
Onuki et al.

(10) Patent No.: US 11,462,538 B2
(45) Date of Patent: Oct. 4, 2022

(54) SEMICONDUCTOR DEVICE

(71) Applicant: SEMICONDUCTOR ENERGY LABORATORY CO., LTD., Atsugi (JP)

(72) Inventors: Tatsuya Onuki, Kanagawa (JP); Takanori Matsuzaki, Kanagawa (JP); Tomoaki Atsumi, Kanagawa (JP); Takahiko Ishizu, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/767,645

(22) PCT Filed: Nov. 30, 2018

(86) PCT No.: PCT/IB2018/059489
§ 371 (c)(1),
(2) Date: May 28, 2020

(87) PCT Pub. No.: WO2019/111113
PCT Pub. Date: Jun. 13, 2019

(65) Prior Publication Data
US 2020/0373302 A1    Nov. 26, 2020

(30) Foreign Application Priority Data
Dec. 6, 2017   (JP) .............................. JP2017-234257

(51) Int. Cl.
*H01L 27/105*   (2006.01)
*H01L 27/12*    (2006.01)
*H01L 29/786*   (2006.01)

(52) U.S. Cl.
CPC ........ *H01L 27/1052* (2013.01); *H01L 27/124* (2013.01); *H01L 27/1207* (2013.01);
(Continued)

(58) Field of Classification Search
CPC ............. H01L 27/1052; H01L 27/1207; H01L 27/1225; H01L 27/124; H01L 27/1255; H01L 29/78648; H01L 29/7869
(Continued)

(56) References Cited

U.S. PATENT DOCUMENTS 4,347,424 A * 8/1982 Obara .................... B23H 1/022
                                                   219/69.13
4,748,418 A * 5/1988 Kerth ...................... H03F 1/303
                                                       327/89
(Continued)

FOREIGN PATENT DOCUMENTS

JP       06-021443 A     1/1994
JP       2007-067275 A   3/2007
(Continued)

OTHER PUBLICATIONS

International Search Report (Application No. PCT/IB2018/059489) dated Mar. 5, 2019.
(Continued)

*Primary Examiner* — Ori Nadav
(74) *Attorney, Agent, or Firm* — Fish & Richardson P.C.

(57) ABSTRACT

A novel semiconductor device is provided. A back gate voltage of a transistor including a gate and a back gate is adjusted based on the operating temperature. The operating temperature is acquired by a temperature detector circuit. The temperature detection circuit outputs the temperature information as a digital signal. The digital signal is input to a voltage control circuit. The voltage control circuit outputs a first voltage corresponding to the digital signal. The back gate voltage is determined by a voltage in which a first voltage is added to a reference voltage.

9 Claims, 18 Drawing Sheets

(52) U.S. Cl.
CPC ...... *H01L 27/1225* (2013.01); *H01L 27/1255* (2013.01); *H01L 29/7869* (2013.01); *H01L 29/78648* (2013.01)

(58) Field of Classification Search
USPC .......................................................... 257/43
See application file for complete search history.

(56) References Cited

U.S. PATENT DOCUMENTS

| | | | |
|---|---|---|---|
| 5,461,338 A | 10/1995 | Hirayama et al. | |
| 8,737,109 B2 | 5/2014 | Yamazaki et al. | |
| 8,791,749 B2 | 7/2014 | Nakamura et al. | |
| 8,947,158 B2 | 2/2015 | Watanabe | |
| 9,024,317 B2 | 5/2015 | Endo et al. | |
| 9,076,505 B2 | 7/2015 | Atsumi et al. | |
| 9,337,826 B2 | 5/2016 | Koyama et al. | |
| 10,192,871 B2 | 1/2019 | Onuki et al. | |
| 2002/0140378 A1* | 10/2002 | Volk | H05B 45/46 315/291 |
| 2003/0001693 A1* | 1/2003 | Guitton | H03H 7/06 333/170 |
| 2003/0128998 A1* | 7/2003 | Nishi | G03G 15/2042 399/67 |
| 2007/0177313 A1* | 8/2007 | Sumita | G05F 3/205 361/18 |
| 2009/0115542 A1* | 5/2009 | Nakamura | H03B 5/368 331/176 |
| 2013/0153900 A1* | 6/2013 | Kinouchi | H01L 29/7815 257/48 |
| 2013/0166087 A1* | 6/2013 | Yamanaka | G06F 1/263 700/295 |
| 2013/0181767 A1 | 7/2013 | Nakakuki et al. | |
| 2014/0086276 A1* | 3/2014 | Kishi | G01K 7/32 374/172 |
| 2014/0269813 A1* | 9/2014 | Lee | H03L 7/093 374/1 |
| 2017/0309325 A1 | 10/2017 | Onuki et al. | |
| 2018/0090498 A1 | 3/2018 | Onuki et al. | |

FOREIGN PATENT DOCUMENTS

| | | |
|---|---|---|
| JP | 2012-069932 A | 4/2012 |
| JP | 2012-146965 A | 8/2012 |
| JP | 2013-168631 A | 8/2013 |
| JP | 2018-056558 A | 4/2018 |
| TW | 201834208 | 9/2018 |
| WO | WO-2012/060032 | 5/2012 |

OTHER PUBLICATIONS

Written Opinion (Application No. PCT/IB2018/059489) dated Mar. 5, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Taiwanese Office Action (Application No. 107143566) dated Feb. 10, 2022.

* cited by examiner

SEMICONDUCTOR DEVICE

CROSS REFERENCE TO RELATED APPLICATIONS

This application is a U.S. National Phase Application under 35 U.S.C. § 371 of International Application PCT/IB2018/059489, filed on Nov. 30, 2018, which is incorporated by reference and claims the benefit of a foreign priority application filed in Japan on Dec. 6, 2017, as Application No. 2017-234257.

TECHNICAL FIELD

One embodiment of the present invention relates to a semiconductor device.

One embodiment of the present invention relates to an object, a method, or a manufacturing method. One embodiment of the present invention relates to a process, a machine, manufacture, or a composition of matter. One embodiment of the present invention relates to a driving method thereof or a manufacturing method thereof.

In this specification and the like, a semiconductor device means every device that can function by utilizing semiconductor characteristics. A memory device, a display device, an electro-optical device, a power storage device, a semiconductor circuit, and an electronic device include a semiconductor device in some cases.

BACKGROUND ART

A silicon-based semiconductor material is widely known as a semiconductor thin film that can be applied to a transistor, but an oxide semiconductor (OS) has been attracting attention as another material. As an oxide semiconductor, not only single-component metal oxides, such as indium oxide and zinc oxide, but also multi-component metal oxides are known for example. Among the multi-component metal oxides, in particular, an In—Ga—Zn oxide (hereinafter also referred to as IGZO) has been actively studied.

From the studies on IGZO, in an oxide semiconductor, a c-axis aligned crystalline (CAAC) structure and a nanocrystalline (nc) structure, which are not single crystal nor amorphous, have been found (see Non-Patent Documents 1 to 3). In Non-Patent Document 1 and Non-Patent Document 2, a technique for forming a transistor using an oxide semiconductor having the CAAC structure is also disclosed. Moreover, Non-Patent Document 4 and Non-Patent Document 5 disclose that a fine crystal is included even in an oxide semiconductor which has lower crystallinity than those of the CAAC structure or the nc structure.

In addition, a transistor which includes IGZO as an active layer has an extremely low off-state current (see Non-Patent Document 6), and an LSI and a display utilizing the characteristics have been reported (see Non-Patent Document 7 and Non-Patent Document 8).

A variety of semiconductor devices including a transistor including an oxide semiconductor in a channel formation region (hereinafter also referred to as an OS transistor) has been proposed.

Patent Document 1 discloses an example in which an OS transistor is used in a dynamic random access memory (DRAM). The OS transistor has extremely low leakage current in an off state (off-state current); thus, a DRAM having a long refresh period and low power consumption can be fabricated.

Patent Document 2 discloses a nonvolatile memory using an OS transistor. Unlike the flash memory, the nonvolatile memory has unlimited cycle of rewriting, can easily operate at high speed, and consumes less power.

In such memories including OS transistors, an increase in the threshold voltage of the OS transistors can reduce the off-state current and thus can improve data retention characteristics of the memories. Patent Document 2 discloses an example in which an OS transistor is provided with a second gate so that the threshold voltage of the OS transistor can be controlled to reduce the off-state current.

For long-term data retention of the memory, a constant negative potential needs to be continuously applied to the second gate of the OS transistor. Patent Document 2 and Patent Document 3 disclose a configuration example of a circuit for driving a second gate of an OS transistor.

REFERENCES

Patent Document

[Patent Document 1] Japanese Published Patent Application No. 2013-168631
[Patent Document 2] Japanese Published Patent Application No. 2012-069932
[Patent Document 3] Japanese Published Patent Application No. 2012-146965

Non-Patent Document

[Non-Patent Document 1] S. Yamazaki et al., "SID Symposium Digest of Technical Papers", 2012, Volume 43, Issue 1, pp. 183-186.
[Non-Patent Document 2] S. Yamazaki et al., "Japanese Journal of Applied Physics", 2014, Volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problem to be Solved by the Invention

One object of one embodiment of the present invention is to provide a semiconductor device with large on-state current. One object of one embodiment of the present invention is to provide a semiconductor device that operates at high speed. One object of one embodiment of the present invention is to provide a semiconductor device capable of holding data for a long period of time. One object of one embodiment of the present invention is to provide a semiconductor device with low power consumption. One object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, claims, and the like, and also such objects can be an object of one embodiment of the present invention.

Means for Solving the Problem

One embodiment of the present invention is a semiconductor device including a first circuit, a second circuit, a third circuit, a fourth circuit, and an output terminal, and the semiconductor device is characterized in that the first circuit has a function of supplying a voltage to the second circuit; the second circuit has a function of supplying a first voltage to the output terminal and a function of holding a voltage of the output terminal; the third circuit has a function of obtaining temperature information and a function of supplying a digital signal corresponding to the temperature information to the fourth circuit; the fourth circuit has a function of outputting a second voltage corresponding to the digital signal; and the voltage of the output terminal is a total voltage of the first voltage and the second voltage.

The fourth circuit preferably has a plurality of capacitors. The plurality of capacitors are each electrically connected to the output terminal. The plurality of capacitors preferably have different capacitance values.

Effect of the Invention

According to one embodiment of the present invention, a semiconductor device with large on-state current can be provided. According to one embodiment of the present invention, a semiconductor device that operates at high speed can be provided. According to one embodiment of the present invention, a semiconductor device capable of holding data for a long period of time can be provided. According to one embodiment of the present invention, a semiconductor device with low power consumption can be provided. According to one embodiment of the present invention, a novel semiconductor device can be provided.

Note that the description of these effects does not preclude the existence of other effects. One embodiment of the present invention does not necessarily have all the effects. Other effects will be apparent from and can be derived from the description of the specification, the drawings, the claims, and the like.

MODE FOR CARRYING OUT THE INVENTION

Figure 1A:
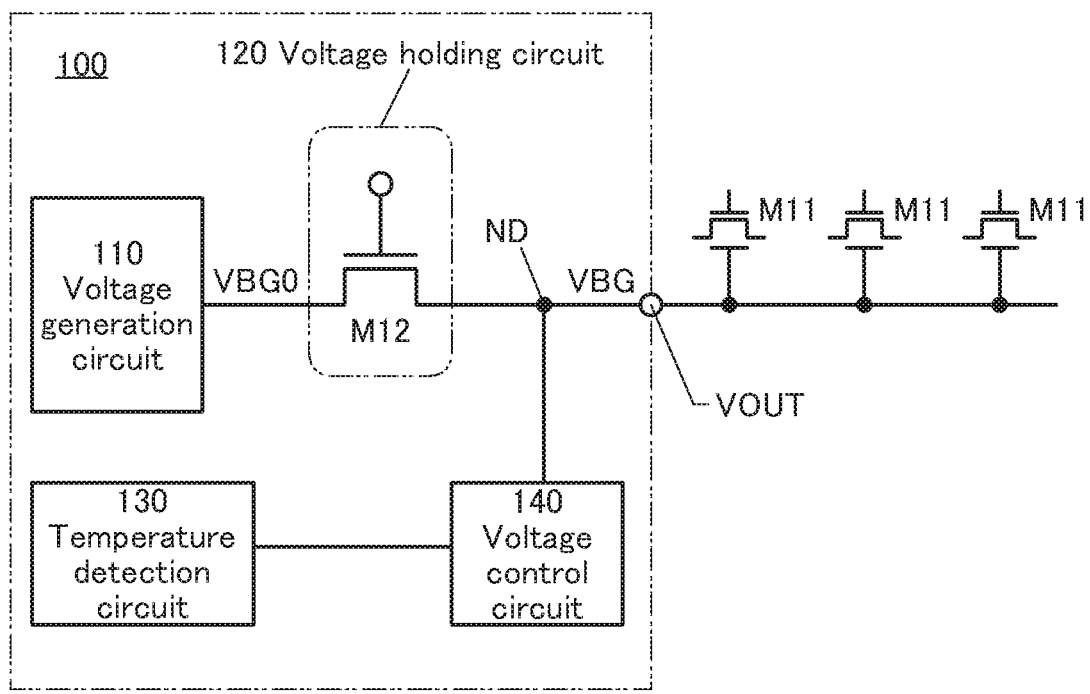
FIGS. 1A and 1B Diagrams illustrating a configuration example of a semiconductor device.

Embodiments according to the present invention will be described in detail with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments and examples below.

Note that in the structures of the invention described below, the same portions or portions having similar functions are denoted by the same reference numerals in different drawings, and repeated description of such portions is omitted. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification, a high-power supply voltage is referred to as an H level (also referred to as "VDD" or "H potential"), and a low-power supply voltage is referred to as an L level (also referred to as "GND" or "L potential") in some cases.

Furthermore, in this specification, the embodiments and the examples below can be combined as appropriate. In addition, in the case where a plurality of structure examples are described in one embodiment, the structure examples can be combined as appropriate.

In this specification and the like, a metal oxide means an oxide of metal in a broad sense. Metal oxides are classified into an oxide insulator, an oxide conductor (including a transparent oxide conductor), an oxide semiconductor, and the like. For example, a metal oxide used in a semiconductor layer of a transistor is referred to as an oxide semiconductor in some cases. In addition, in the case where an OS transistor is mentioned, the OS transistor can also be referred to as a transistor including a metal oxide or an oxide semiconductor. In this specification and the like, a metal oxide including nitrogen is also referred to as a metal oxide in some cases.

Furthermore, unless otherwise specified, transistors described in this specification and the like are enhancement-type (normally-off-type) n-channel field effect transistors. Thus, the threshold voltage (also referred to as "Vth") is higher than 0 V.

Embodiment 1

<Semiconductor Device 100>

FIG. 1 shows circuit diagrams illustrating a configuration example of a semiconductor device 100 of one embodiment of the present invention. The semiconductor device 100 includes a voltage generation circuit 110, a voltage holding circuit 120, a temperature detection circuit 130, and a voltage control circuit 140. The node of the voltage holding circuit 120 and the voltage control circuit 140 is referred to as a node ND. The voltage holding circuit 120 and the voltage control circuit 140 are electrically connected to an output terminal VOUT through the node ND.

The semiconductor device 100 is electrically connected to second gates of a plurality of transistors M11 through the output terminal VOUT. The transistor M11 is a transistor including a first gate (also referred to as a "front gate" or simply a "gate") and the second gate (also referred to as a "back gate"). The first gate and the second gate have a region that overlaps with each other with a semiconductor layer positioned therebetween. The second gate electrode has, for example, a function of controlling the threshold voltage of the transistor M11.

The transistor M11 represents a transistor included in a variety of circuits included in a memory device, a pixel device, an arithmetic device, and the like. For example, the transistor M11 represents a transistor included in a NOR or a NAND memory device. Furthermore, the transistor M11 represents a transistor included in a display device such as a liquid crystal display device or an EL display device. In addition, the transistor M11 represents a transistor included in a central processing unit (CPU), a graphic processing unit (GPU), a field programmable gate array (FPGA), or the like, for example.

Although three transistors M11 are illustrated in FIG. 1, one embodiment of the present invention is not limited thereto, and the semiconductor device 100 may be connected to more transistors M11.

Figure 2A:
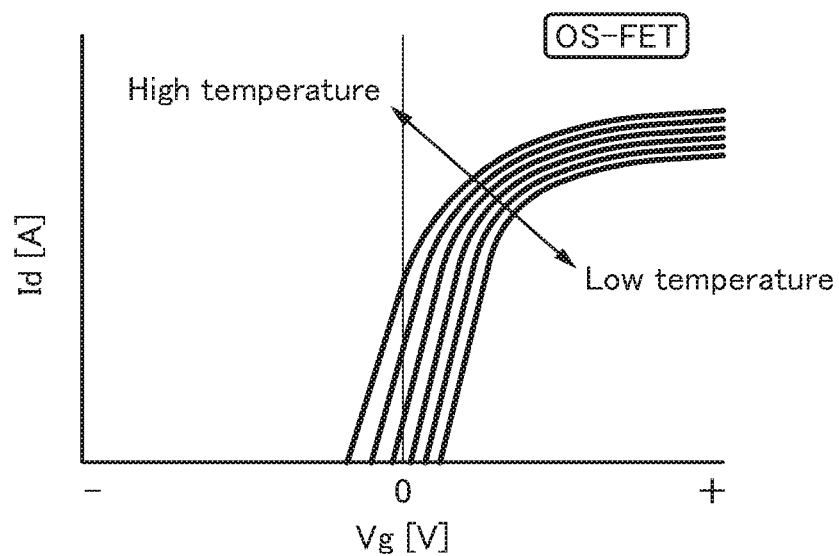
FIGS. 2A and 2B Diagrams illustrating electrical characteristics of transistors.
Figure 2B:
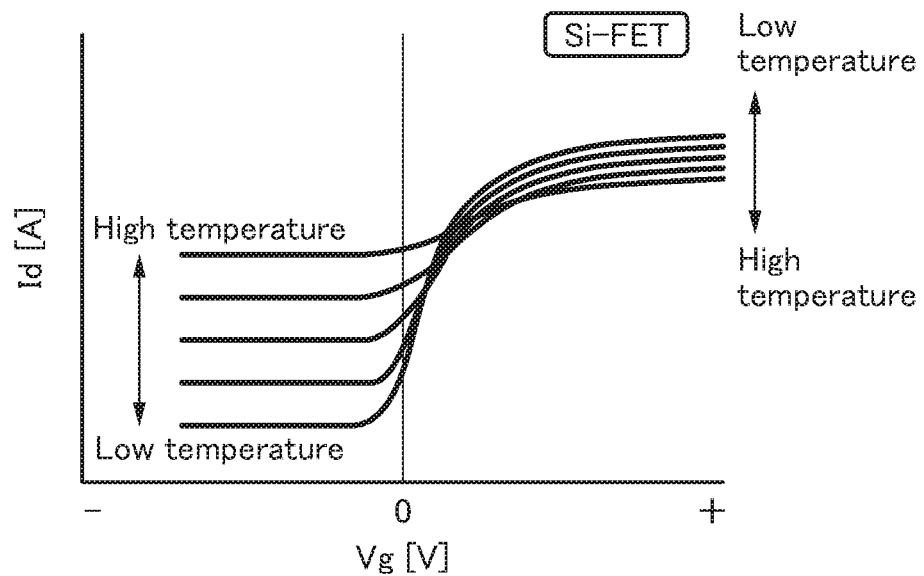

Here, temperature dependence of Id-Vg characteristics, which are ones of electrical characteristics of a transistor, is described. FIG. 2(A) and FIG. 2(B) show examples of Id-Vg characteristics, which are ones of electrical characteristics of a transistor. The Id-Vg characteristics show a change in drain current (Id) with respect to a change in gate voltage (Vg). The horizontal axes of FIG. 2(A) and FIG. 2(B) represent Vg on a linear scale. The vertical axes of FIG. 2(A) and FIG. 2(B) represent Id on a log scale.

FIG. 2(A) shows the Id-Vg characteristics of an OS transistor. FIG. 2(B) shows Id-Vg characteristics of a transistor using silicon for a semiconductor layer where a channel is formed (also referred to as a "Si transistor"). Note that both FIG. 2(A) and FIG. 2(B) show the Id-Vg characteristics of n-channel transistors.

As shown in FIG. 2(A), the off-state current of the OS transistor is less likely to increase even in the operation at high temperatures. In addition, Vth of the OS transistor shifts in the negative direction as the operation temperature rises, and its on-state current increases. By contrast, as illustrated in FIG. 2(B), the off-state current of the Si transistor increases with the temperature rise. In addition, Vth of the Si transistor shifts in the positive direction as the temperature rises, and its on-state current lowers.

Thus, when an OS transistor is used as the transistor M11, the power consumption of the whole semiconductor device including the transistor M11 can be reduced even in the operation at high temperatures.

The semiconductor device 100 has a function of writing a voltage VBG to the second gate of the transistors M11 and holding the voltage. For example, in the case where a negative potential is supplied as voltage VBG, Vth can be shifted in the positive direction while the negative potentials of the second gates of the transistors M11 are held. Under a high-temperature operation, Vth can be kept high. For example, in the case where the transistor M11 is used as a selection transistor of a memory cell, electric charge in a capacitor functioning as a storage can be held for a long period of time.

[Voltage Generation Circuit 110]

Figure 3A:
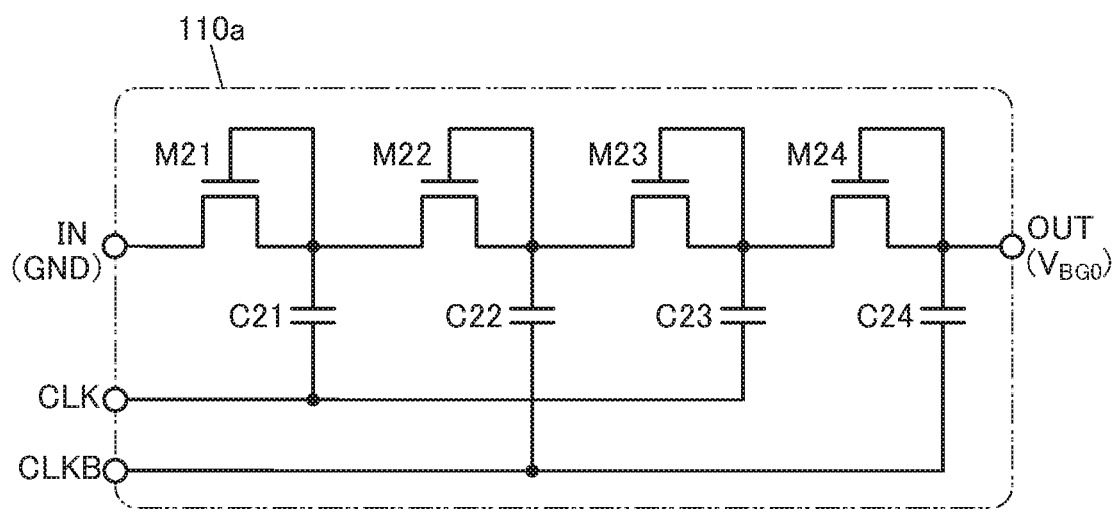
FIGS. 3A and 3B Diagrams illustrating configuration examples of voltage generation circuits.
Figure 3B:
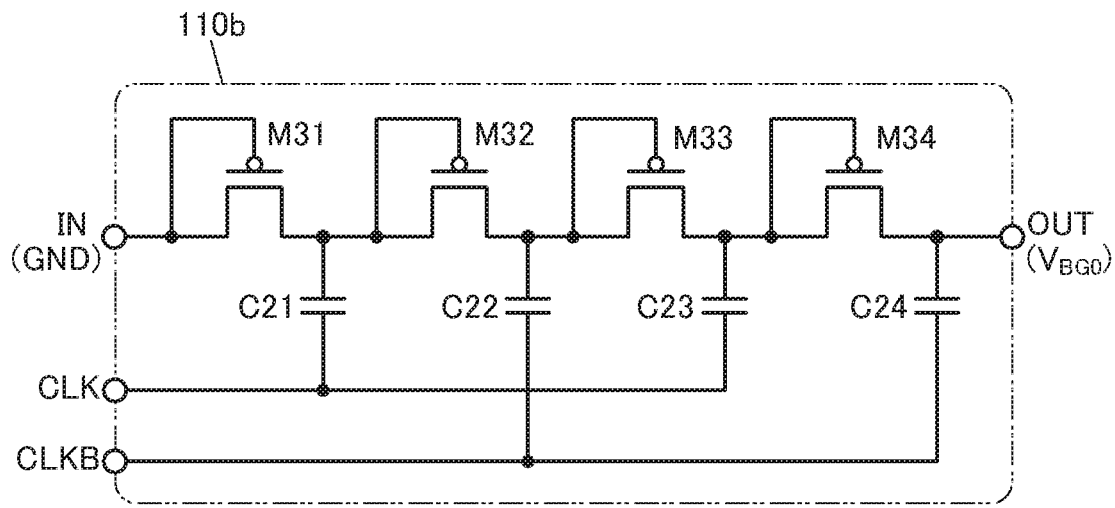

FIGS. 3(A) and 3(B) show circuit configuration examples of the voltage generation circuit 110. These circuit diagrams are step-down charge pump circuits, in which GND is input to an input terminal IN and VBG0 is output from an output terminal OUT. The number of stages of fundamental circuits in the charge pump circuit is four used here as one example; however, it is not limited to this, and the charge pump circuit may be configured with given stages.

A voltage generation circuit 110a illustrated in FIG. 3(A) includes a transistor M21 to a transistor M24 and a capacitor C21 to a capacitor C24.

The transistor M21 to the transistor M24 are connected in series between the input terminal IN and the output terminal OUT, and a gate and a first electrode of each transistor are connected so that the transistor functions as a diode. The gates of the transistor M21 to the transistor M24 are connected to the capacitor C21 to the capacitor C24, respectively.

To first electrodes of the capacitor C21 and the capacitor C23 in the odd-numbered stages, CLK is input, and to first electrodes of the capacitors C22 and C24 in the even-numbered stages, CLKB is input. The CLKB is an inverted clock signal obtained by phase inversion of the CLK.

The voltage generation circuit 110a has a function of stepping down GND input to the input terminal IN and generating VBG0. The voltage generation circuit 110a can generate a negative potential only by the supply of the CLK and CLKB.

The transistor M21 to the transistor M24 described above may be formed using OS transistors. The OS transistors are preferably used because the reverse current of the diode-connected transistor M21 to the transistor M24 can be reduced.

A voltage generation circuit 110b in FIG. 3(B) is composed of a transistor M31 to a transistor M34 that are p-channel transistors. The description of the voltage generation circuit 110a is referred to for the other components.

The voltage generation circuit 110 may be not only a step-down charge pump but also a step-up charge pump. The voltage generation circuit 110 may include both a step-down charge pump and a step-up charge pump.

[Voltage Holding Circuit 120]

The voltage holding circuit 120 includes a transistor M12 (see FIG. 1(A)). A first terminal (one of a source and a drain) of the transistor M12 is electrically connected to the voltage generation circuit 110, and a second terminal (the other of the source and the drain) of the transistor M12 is electrically connected to the node ND.

The voltage holding circuit 120 has a function of supplying the voltage VBG0 generated by the voltage generation circuit 110 to the node ND by turning on the transistor M12. When the threshold voltage of the transistor M12 is set to Vth1, it is preferable to apply a voltage of VBG0+Vth1 or higher to a gate of the transistor M12 in order to turn on the transistor M12. The voltage holding circuit 120 has a function of holding the voltage of the node ND by turning off the transistor M12.

Figure 4A:
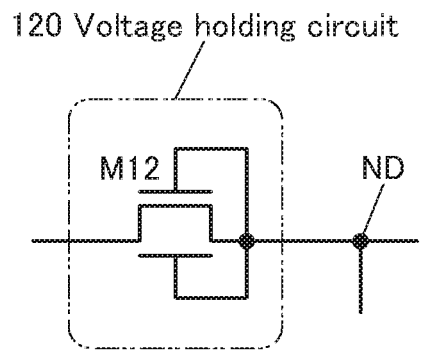
FIGS. 4A to 4C Diagrams illustrating configuration examples of voltage holding circuits.

In the case where a negative potential is supplied as the voltage VBG0, a transistor including a first gate and a second gate may be used as the transistor M12 and the first gate and the second gate may be electrically connected to the second terminal (see FIG. 4(A)). In that case, the transistor M12 can function as a diode. In addition, when a voltage output from the transistor M12 is set to a voltage VBG1, the relationship of VBG1=VBG0+Vth1 is satisfied. By setting the first terminal of the transistor M12 to GND, the negative potential written to the node ND can be held.

In the transistor M12 illustrated in FIG. 4(A), when a negative potential is supplied to the node ND and then the first terminal is set to GND, Vg becomes 0 V. Thus, Id at Vg of 0 V (also referred to as a "cutoff current") is preferably low. By making the cutoff current sufficiently low, the negative potential written to the node ND can be held for a long period of time.

The channel length of the transistor M12 is preferably longer than the channel length of the transistor M11. In the case where the channel length of the transistor M11 is less than 1 μm, for example, the channel length of the transistor M12 is greater than or equal to 1 μm, preferably greater than or equal to 3 μm, further preferably greater than or equal to 5 μm, and still further preferably greater than or equal to 10 μm. The transistor M12 has a longer channel length, whereby the transistor M12 is not affected by a short-channel effect, and the cutoff current can be small. Furthermore, the withstand voltage between a source and a drain of the transistor M12 can be increased. The high withstand voltage between the source and the drain of the transistor M12 facilitates a connection between the transistor M11 and the voltage generation circuit 110 generating a high voltage, which is preferable.

An OS transistor or a transistor using a wide bandgap semiconductor in a channel formation region is preferably used as the transistor M12. The OS transistor and the transistor using a wide-bandgap semiconductor has a low cutoff current and a high withstand voltage between a source and a drain. Note that in this specification, the term "wide-bandgap semiconductor" is a semiconductor whose bandgap is 2.2 eV or greater. Examples of the wide-bandgap semiconductor are silicon carbide, gallium nitride, diamond, and the like.

The transistor M12 is required to have the cutoff current lower than that of the transistor M11. By contrast, the transistor M11 is required to have the on-state current higher than that of the transistor M12. Like this, in the case where transistors having different required properties are fabricated over the same substrate, the transistors are formed using different semiconductors. The transistor M12 preferably uses a semiconductor having a wider bandgap than that of the transistor M11 in a channel formation region. The transistor M11 preferably uses a semiconductor having higher electron mobility than that of the transistor M12 in the channel formation region.

Figure 4B:
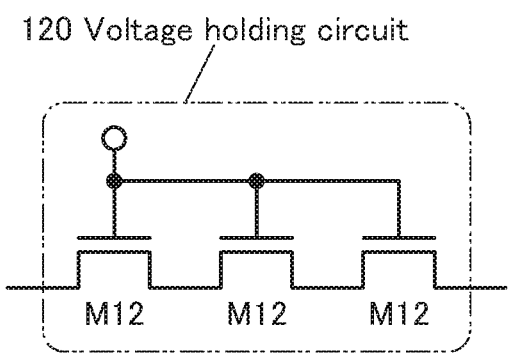
Figure 4C:
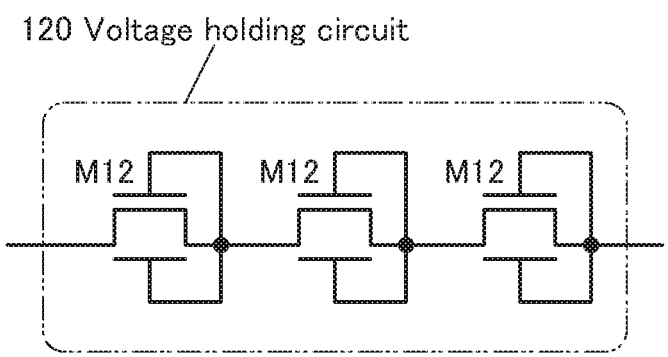

The voltage holding circuit 120 may be composed of a plurality of transistors M12 connected in series (see FIGS. 4(B) and 4(C)).

[Temperature Detection Circuit 130]

Figure 5:
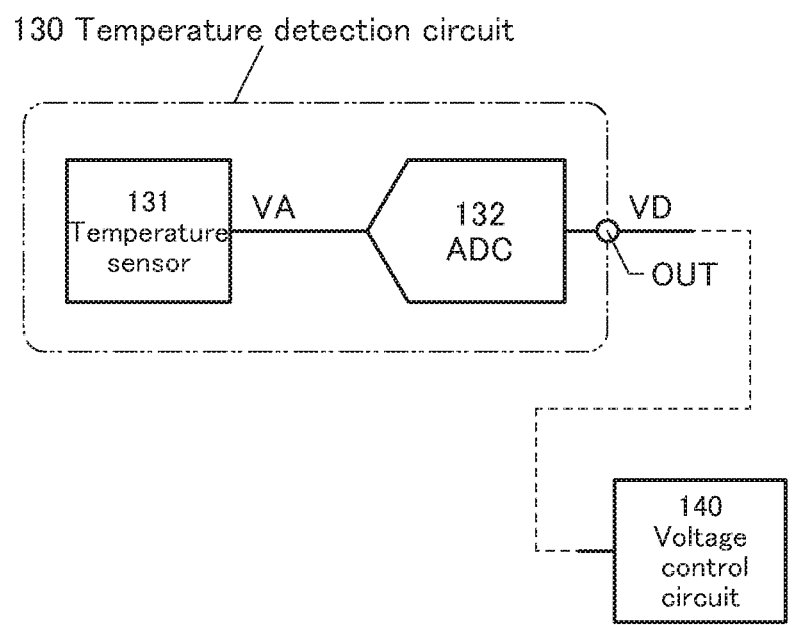
FIG. 5A diagram illustrating a configuration example of a temperature detection circuit.

The temperature detection circuit 130 includes a temperature sensor 131 and an analog-digital converter circuit (also referred to as "ADC") 132 (see FIG. 5).

The temperature sensor 131 has a function of sensing the temperature of the semiconductor device 100 and outputting an analog signal VA corresponding to the temperature. As the temperature sensor 131, for example, a resistance thermometer of platinum, nickel, copper, or the like, a thermistor, a thermocouple, an IC temperature sensor, or the like can be used.

The analog-digital converter circuit 132 has a function of converting the analog signal VA into an n-bit digital signal VD (n is an integer greater than or equal to 1). The digital signal VD is output from the temperature detection circuit 130 and supplied to the voltage control circuit 140.

By converting the temperature information that is the analog signal detected by the temperature detection circuit 130 into a digital signal and outputting the digital signal, signal attenuation due to wiring resistance and parasitic capacitance or noise influence can be reduced. Thus, even in the case where the temperature detection circuit 130 is provided apart from the voltage control circuit 140, the temperature information can be accurately transmitted to the voltage control circuit 140.

[Voltage Control Circuit 140]

As described with reference to FIG. 2(A), as the temperature is lower, Vth of the OS transistor positively shifts, so that the on-state current is decreased. As a result, the operation speed of a circuit is lowered. Furthermore, as the temperature is higher, Vth negatively shifts, and the cutoff current is increased. This leads to a narrow temperature range in which a circuit can operate. By applying a correction voltage corresponding to the operation temperature to the node ND with the use of the control circuit 140, the voltage output from the output terminal VOUT of the semiconductor device 100 can be corrected, and the temperature range in which the circuit electrically connected to the output terminal VOUT can operate can be widened.

Figure 1B:
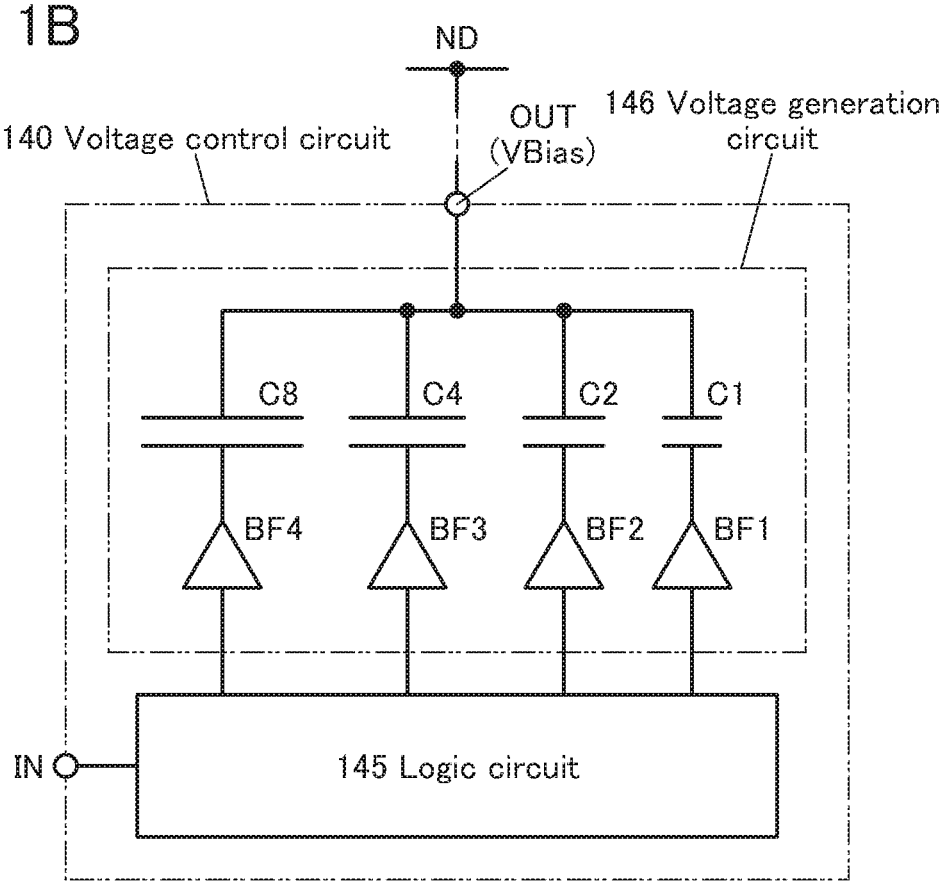

The voltage control circuit 140 includes a logic circuit 145 and a voltage generation circuit 146 (see FIG. 1(B)). The logic circuit 145 has a function of supplying a digital signal (temperature information) supplied from the temperature detection circuit 130 to the voltage generation circuit 146. For example, the logic circuit 145 converts a serial signal supplied from the temperature detection circuit 130 into a parallel signal and supplies the parallel signal to the voltage generation circuit 146. In addition, the logic circuit 145 has a function of converting an n-bit digital signal supplied from the temperature detection circuit 130 into an m-bit digital signal (m is an integer greater than or equal to 1) and supplying the m-bit digital signal to the voltage generation circuit 146.

The voltage generation circuit 146 has a function of converting the m-bit digital signal supplied from the logic circuit 145 into 2' levels of voltage and outputting the voltage. FIG. 1(B) illustrates a case where m is 4. In FIG. 1(B), the voltage generation circuit 146 includes a buffer BF1, a buffer BF2, a buffer BF3, a buffer BF4, a capacitor C1, a capacitor C2, a capacitor C4, and a capacitor C8.

A 4-bit digital signal output from the logic circuit 145 is supplied to inputs of the buffer BF1 to the buffer BF4. Specifically, the information at the first digit of the 4-bit digital signal is input to the buffer BF1, the information at the second digit is input to the buffer BF2, the information at the third digit is input to the buffer BF3, and the information at the fourth digit is input to the buffer BF4.

One electrode of the capacitor C1 is electrically connected to an output of the buffer BF1, and the other electrode of the capacitor C1 is electrically connected to the output terminal OUT. One electrode of the capacitor C2 is electrically connected to an output of the buffer BF2, and the other electrode of the capacitor C2 is electrically connected to the output terminal OUT. One electrode of the capacitor C4 is electrically connected to an output of the buffer BF3, and the other electrode of the capacitor C4 is electrically connected to the output terminal OUT. One electrode of the capacitor C8 is electrically connected to an output of the buffer BF4, and the other electrode of the capacitor C8 is electrically connected to the output terminal OUT.

A voltage output from the output terminal OUT of the voltage control circuit 140 is referred to as a voltage "VBias". The output terminal OUT of the voltage control circuit 140 is electrically connected to the node ND of the semiconductor device 100.

A voltage applied to the node ND from the voltage control circuit 140 is determined based on the ratio of a total capacitance of the capacitor C1, the capacitor C2, the capacitor C4, and the capacitor C8 to the parasitic capacitance generated in the node ND. The capacitance value of the capacitor C1 is preferably much larger than the capacitance value of the parasitic capacitance. Specifically, the capacitance value of the capacitor C1 is preferably five times or more the capacitance value of the parasitic capacitance, more preferably ten times or more the capacitance value of the parasitic capacitance.

The capacitance values of the capacitor C1, the capacitor C2, the capacitor C4, and the capacitor C8 may be the same, but it is preferable that at least part or all of the capacitors have different capacitance values. In this embodiment, the capacitance value of the capacitor C2 is twice the capacitance value of the capacitor C1, the capacitance value of the capacitor C4 is four times the capacitance value of the capacitor C1, and the capacitance value of the capacitor C8 is 8 times the capacitance value of the capacitor C1. In this way, 16 levels of voltage can be supplied to the node ND from the voltage control circuit 140.

Figure 6A:
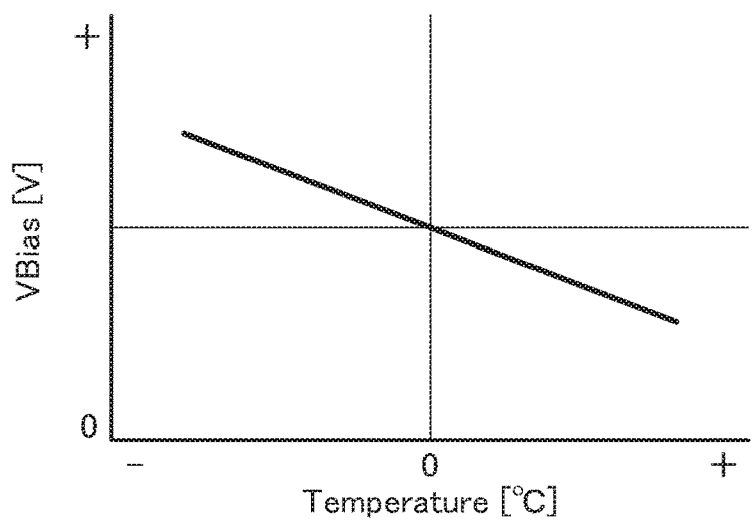
FIGS. 6A to 6C Diagrams illustrating variation examples of a voltage VBias with respect to a temperature change.
Figure 6B:
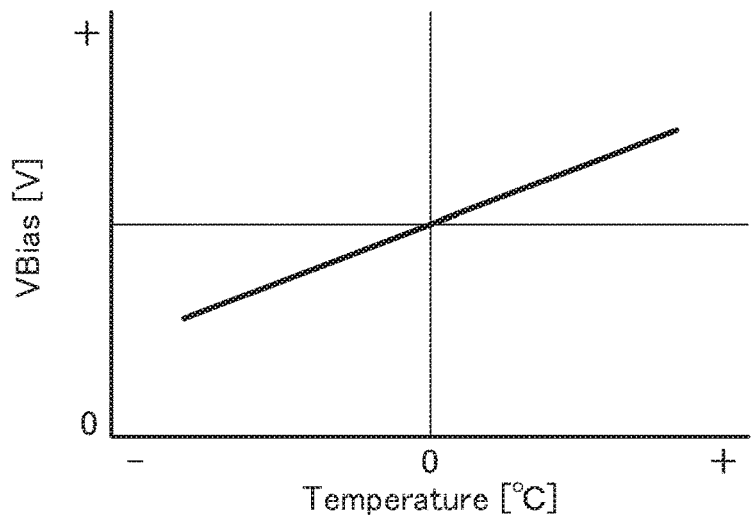
Figure 6C:
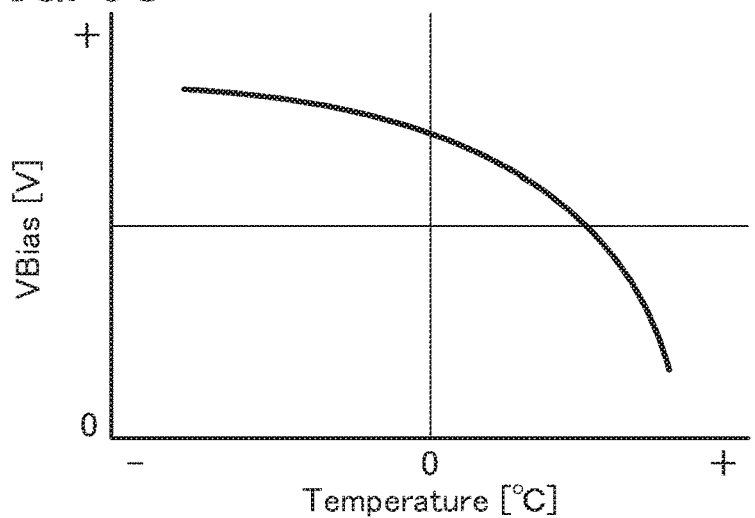

FIGS. 6(A) to 6(C) show examples of a change in a voltage VBias with respect to a temperature change. The horizontal axes of FIGS. 6(A) to 6(C) represent the temperature on a linear scale. The vertical axes of FIGS. 6(A) to 6(C) represent the voltage VBias on a linear scale. In the case where the transistor M11 is an OS transistor, the level of the voltage VBias preferably becomes lower as the operation temperature of the transistor M11 is higher (see FIG. 6(A)). Alternatively, the level of the voltage VBias may become higher as the operation temperature is higher (see FIG. 6(B)) depending on the purpose and the use. In addition, the level of the voltage VBias may change non-linearly with respect to the temperature change (see FIG. 6(C)). A voltage change in the voltage VBias with respect to the temperature change can be set by the logic circuit 145.

<Operation Example of Semiconductor Device 100>

Figure 7:
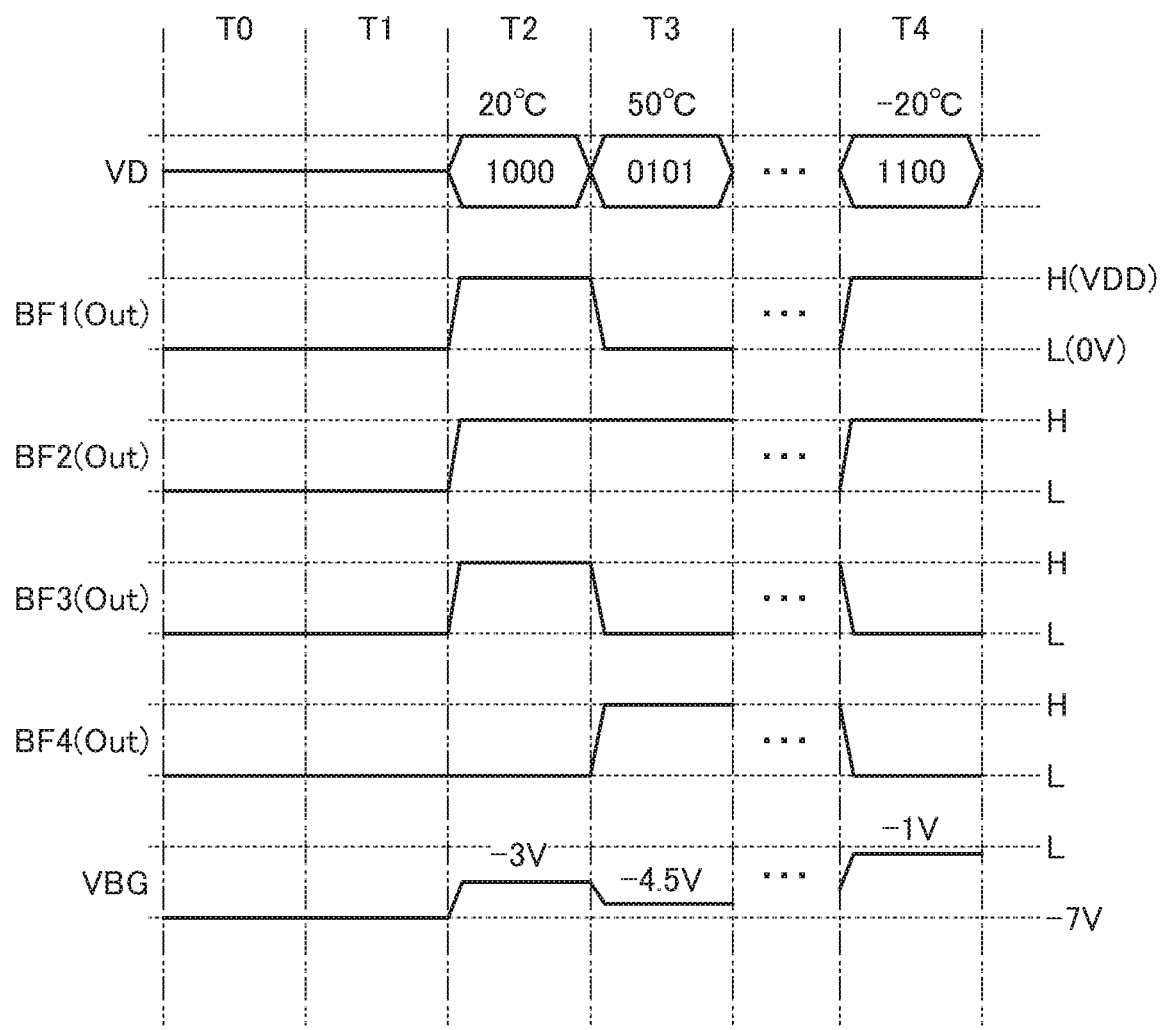
FIG. 7A timing chart illustrating an operation example of a semiconductor device.

FIG. 7 is a timing chart illustrating an operation example of the semiconductor device 100. This embodiment describes an operation example in which the voltage Vbias changes linearly in the range of 0 V to 7.5 V when the transistor M11 is an OS transistor and the operating temperature changes in the range of 100° C. to −50° C. In addition, the voltage VBG becomes −3 V at an operating temperature of 20° C.

A 4-bit digital signal VD is output from the temperature detection circuit 130. In this embodiment, "0000" is output as the digital signal VD at an operating temperature of 100° C. and "1111" is output at an operating temperature of −50° C.

Furthermore, when the output of the buffer BF1 connected to the one electrode of the capacitor C1 is changed from an L potential to an H potential, the potential of the other electrode of the capacitor C1 is increased by 0.5 V. In addition, when the output of the buffer BF2 connected to the one electrode of the capacitor C2 is changed from the L potential to the H potential, the potential of the other electrode of the capacitor C2 is increased by 1.0 V. In addition, when the output of the buffer BF3 connected to the one electrode of the capacitor C4 is changed from the L potential to the H potential, the potential of the other electrode of the capacitor C4 is increased by 2.0 V. In addition, when the output of the buffer BF4 connected to the one electrode of the capacitor C8 is changed from the L potential to the H potential, the potential of the other electrode of the capacitor C8 is increased by 4.0 V.

[Period T0]

A period T0 is a reset period. In the period T0, the L potential (0 V) is output from the output of each of the buffer BF1 to the buffer BF4. Furthermore, the voltage VBG0 is set to −7 V to turn on the transistor M12. Thus, the voltage VBG becomes −7 V. In the period T0, the temperature detection circuit 130 may stop the output of the digital signal VD. Alternatively, the operation of the temperature detection circuit 130 may be stopped.

[Period T1]

In a period T1, the transistor M12 is turned off. The voltage of the node ND is held at −7 V. Thus, the voltage VBG also holds −7 V.

[Period T2]

In a period T2, the digital signal VD (temperature information) is supplied from the temperature detection circuit 130 to the voltage control circuit 140. For example, "1000" is supplied as a digital signal VD that indicates 20° C. to the voltage control circuit 140.

The logic circuit 145 inputs a potential corresponding to the digital signal VD to the buffer BF1 to the buffer BF4. Specifically, in the case where the digital signal VD is "1000", the buffer BF1 to the buffer BF4 are controlled so that the outputs of the buffer BF1 to the buffer BF3 are L potentials and the output of the buffer BF4 is an H potential.

Thus, the potential of the voltage control circuit 140 is increased by 4 V. Accordingly, the voltage of the node ND changes from −7 V to −3 V, so that the voltage VBG becomes −3 V.

[Period T3]

In a period T3, the digital signal VD (temperature information) is supplied from the temperature detection circuit 130 to the voltage control circuit 140. For example, "0101" is supplied to the voltage control circuit 140 as a digital signal VD that indicates 50° C.

Like in the period T2, the logic circuit 145 inputs a potential corresponding to the digital signal VD to the buffer BF1 to the buffer BF4. When the digital signal VD is "0101", the output of the buffer BF1 is the H potential, the output of the buffer BF2 is the L potential, the output of the buffer BF3 is the H potential, and the output of the buffer BF4 is the L potential. Thus, the voltage VBG becomes −4.5 V.

[Period T4]

In a period T4, the digital signal VD (temperature information) is supplied from the temperature detection circuit 130 to the voltage control circuit 140. For example, "1100" is supplied to the voltage control circuit 140 as a digital signal VD that indicates 20° C.

Like in the period T2 and the period T3, the logic circuit 145 inputs potentials corresponding to the digital signal VD to the buffer BF1 to the buffer BF4. When the digital signal VD is "1100", the output of the buffer BF1 is the L potential, the output of the buffer BF2 is the L potential, the output of the buffer BF3 is the H potential, and the output of the buffer BF4 is the H potential. Thus, the voltage VBG becomes −1.0 V.

In this manner, the voltage VBG can be changed depending on the temperature change. In the case where the temperature change of electrical characteristics of the transistor M11 is not considered, a voltage higher than necessary is to be applied to the second gate of the transistor M11. When a voltage higher than necessary is applied to the second gate of the transistor M11 for a long time, the electrical characteristics of the transistor M11 might be degraded and the reliability might be lost. According to one embodiment of the present invention, a voltage applied to the second gate of the transistor M11 can be changed depending on a temperature change. Therefore, a minimal voltage can be applied to the second gate of the transistor M11. According to one embodiment of the present invention, the reliability of a semiconductor device including the transistor M11 can be increased.

Furthermore, a reset period (period T0) may be provided every certain time, so that the voltage of the node ND may be refreshed.

This embodiment can be implemented in combination with any of the structures described in the other embodiments and the like, as appropriate.

Embodiment 2

In this embodiment, a memory device including the semiconductor device 100 described in Embodiment 1 is described.

<Memory Device>

Figure 8:
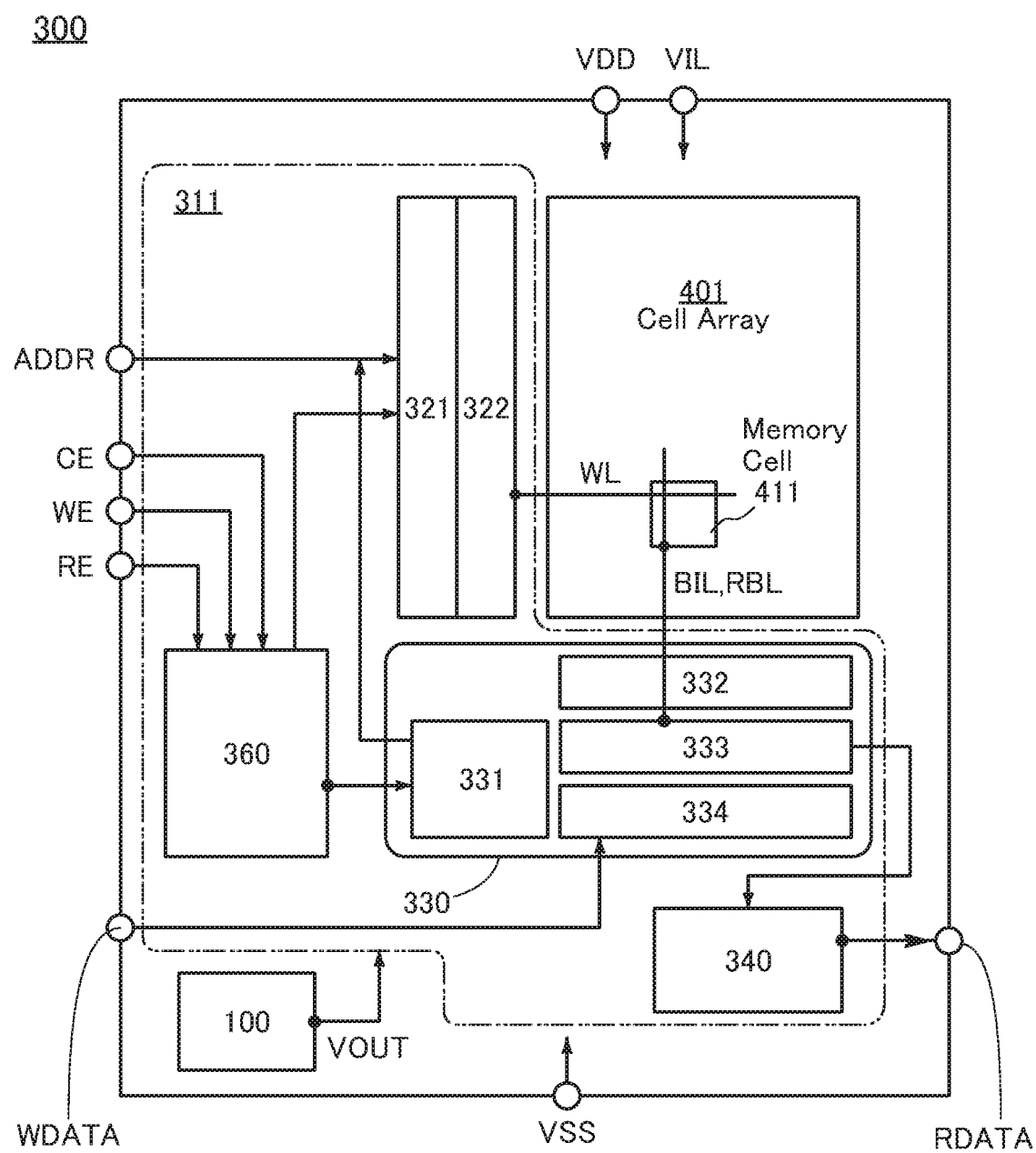
FIG. 8A diagram illustrating a configuration example of a memory device.

FIG. 8 is a block diagram showing a configuration example of a memory device. A memory device 300 includes a peripheral circuit 311, a cell array 401, and the semiconductor device 100. The peripheral circuit 311 includes a row decoder 321, a word line driver circuit 322, a bit line driver circuit 330, an output circuit 340, and a control logic circuit 360.

The word line driver circuit 322 has a function of supplying a potential to a wiring WL. The bit line driver circuit 330 includes a column decoder 331, a precharge circuit 332, an amplifier circuit 333, and a write circuit 334. The precharge circuit 332 has a function of precharging a wiring SL or the like (not illustrated). The amplifier circuit 333 has a function of amplifying a data signal read from a wiring BIL or a wiring RBL. Note that the wiring WL, the wiring SL, the wiring BIL, and the wiring RBL are wirings connected to memory cells 411 included in the cell array 401 and will be described in detail later. The amplified data signal is output as a digital data signal RDATA to the outside of the memory device 300 through the output circuit 340.

As power supply voltages from the outside, a low power supply voltage (VSS), a high power supply voltage (VDD) for the peripheral circuit 311, and a high power supply voltage (VIL) for the memory cell array 401 are supplied to the memory device 300.

Control signals (CE, WE, and RE), an address signal ADDR, and a data signal WDATA are input to the memory device 300 from the outside. The address signal ADDR is input to a row decoder 321 and a column decoder 331, and WDATA is input to a write circuit 334.

The control logic circuit 360 processes the signals (CE, WE, and RE) input from the outside, and generates control signals for the row decoder 321 and the column decoder 331. CE is a chip enable signal, WE is a write enable signal, and RE is a read enable signal. Signals processed by the control logic circuit 360 are not limited to those, and other control signals may be input as necessary.

Note that the circuits and signals described above can be selected as appropriate when needed.

OS transistors can be used as transistors included in the memory cell array 401. In addition, OS transistors can be used as transistors included in the peripheral circuit 311. When the cell array 401 and the peripheral circuit 311 are formed using OS transistors, the cell array 401 and the peripheral circuit 311 can be fabricated in the same manufacturing process, and thus the manufacturing cost can be reduced.

[Configuration Example of Cell Array]

Figure 9:
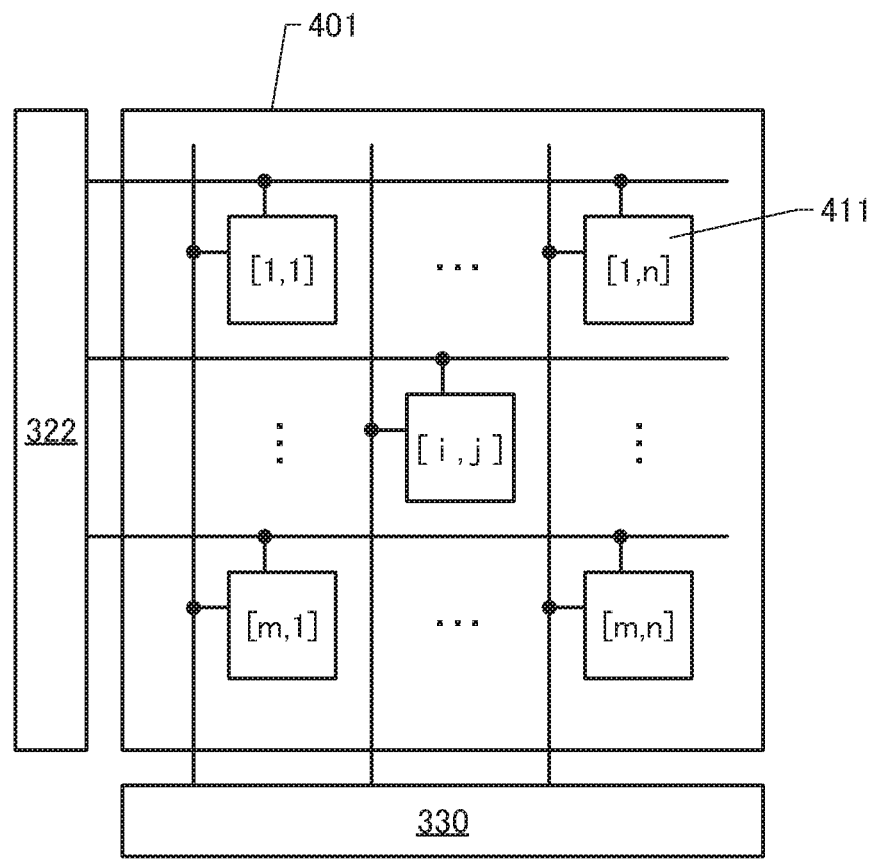
FIG. 9A diagram illustrating a configuration example of a cell array.

FIG. 9 shows a configuration example of the cell array 401. The cell array 401 has m×n memory cells 411 that are m memory cells (m is an integer greater than or equal to 1) in a column and n memory cells (n is an integer greater than or equal to 1) in a row, and the memory cells 411 are arranged in a matrix. The addresses of the memory cells 411 are also shown in FIG. 9. Memory cells 411 at addresses of [1, 1], [m, 1], [i, j], [1, n], and [m, n] (i is an integer greater than or equal to 1 and less than or equal to m, and j is an integer greater than or equal to 1 and less than or equal to n) are shown. The number of wirings connecting the cell array 401 and the word line driver circuit 322 is determined by the configuration of the memory cell 411, the number of memory cells 411 included in one column, or the like. The number of wirings connecting the cell array 401 and the bit line driver circuit 330 is determined by the configuration of the memory cells 411, the number of memory cells 411 included in one row, or the like.

[Configuration Example of Memory Cell]

FIG. 10 illustrates configuration examples of a memory cell 411A to a memory cell 411E that can be used in the above-described memory cell 411.

[DOSRAM]

Figure 10A:
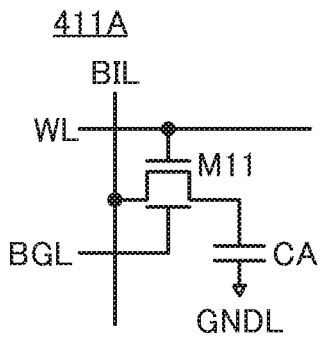
FIGS. 10A to 10E Circuit diagrams illustrating configuration examples of memory cells.

FIG. 10(A) illustrates a circuit configuration example of the memory cell 411A of a DRAM type. In this specification and the like, a DRAM using an OS transistor is referred to as a dynamic oxide semiconductor random access memory (DOSRAM). The memory cell 411A includes the transistor M11 and a capacitor CA.

A first terminal of the transistor M11 is connected to a first terminal of the capacitor CA. A second terminal of the transistor M11 is connected to the wiring BIL. A gate of the transistor M11 is connected to the wiring WL. A back gate of the transistor M11 is connected to a wiring BGL. A second terminal of the capacitor CA is connected to a wiring GNDL. The wiring GNDL is a wiring for supplying a low-level potential (referred to as a reference potential in some cases).

The wiring BIL functions as a bit line, and the wiring WL functions as a word line. The wiring BGL functions as a wiring for applying a potential to the back gate of the transistor M11. The wiring BGL is electrically connected to the output terminal VOUT of the semiconductor device 100.

The threshold voltage of the transistor M11 can be increased or decreased by applying a given potential to the wiring BGL.

Data writing and data reading are performed in such a manner that a high-level potential is applied to the wiring WL to bring the transistor M11 into a conductive state, and thus the wiring BIL is electrically connected to the first terminal of the capacitor CA.

The memory cell included in the above-described memory device 300 is not limited to the memory cell 411A and the circuit configuration can be changed.

In the case where the transistor M11 is used in a memory cell, an OS transistor is preferably used as the transistor M11. An oxide semiconductor containing either one of indium, an element M (the element M is aluminum, gallium, yttrium, or tin), and zinc is preferably used for the semiconductor layer of the OS transistor. In particular, an oxide semiconductor composed of indium, gallium, and zinc is preferably used.

The OS transistor using an oxide semiconductor containing indium, gallium, and zinc has a feature of an extremely low off-state current. The use of the OS transistor for the transistor M11 enables extremely low leakage current of the transistor M11. That is, with the use of the transistor M11, written data can be held for a long time, and thus the frequency of the refresh operation for the memory cell can be decreased. In addition, refresh operation for the memory cell can be unnecessary. In addition, since the OS transistor has an extremely low leakage current, multi-level data or analog data can be held in the memory cell 411A, the memory cell 420, and the memory cell 430.

A DOSRAM can be formed by using an OS transistor as the transistor M11.

[NOSRAM]

Figure 10B:
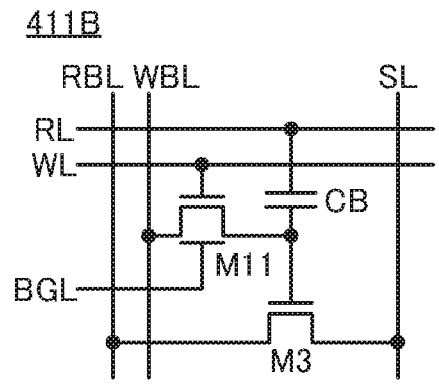

FIG. 10(B) illustrates a circuit configuration example of the memory cell 411B of a gain-cell type (also referred to as a "2Tr1C type") in which two transistors and one capacitor are included. The memory cell 411B includes the transistor M11, a transistor M3, and a capacitor CB.

The first terminal of the transistor M11 is connected to a first terminal of the capacitor CB. The second terminal of the transistor M11 is connected to a wiring WBL. The gate of the transistor M11 is connected to the wiring WL. The back gate of the transistor M11 is connected to the wiring BGL. A second terminal of the capacitor CB is connected to the wiring BL. A first terminal of the transistor M3 is connected to a wiring RBL. A second terminal of the transistor M3 is connected to the wiring SL. A gate of the transistor M3 is connected to the first terminal of the capacitor CB.

The wiring WBL functions as a write bit line, the wiring RBL functions as a read bit line, and the wiring WL functions as a word line. The wiring BL functions as a wiring for applying a predetermined potential to the second terminal of the capacitor CB. A reference potential is preferably applied to the wiring BL when data is written and while data is held.

The wiring BGL functions as a wiring for applying a potential to the back gate of the transistor M11. The wiring BGL is electrically connected to the output terminal VOUT of the semiconductor device 100. The threshold voltage of the transistor M11 can be increased or decreased by applying a given potential to the wiring BGL.

Data writing is performed in such a manner that a high-level potential is applied to the wiring WL to bring the transistor M11 into a conductive state, and thus the wiring WBL is electrically connected to the first terminal of the capacitor CB. Specifically, when the transistor M11 is in the conductive state, a potential corresponding to information to be held is applied to the wiring WBL, and the potential is written to the first terminal of the capacitor CB and the gate of the transistor M3. Then, the low-level potential is applied to the wiring WL to bring the transistor M11 into a non-conductive state, and thereby, the potential of the first terminal of the capacitor CB and the potential of the gate of the transistor M3 are held.

Data reading is performed by applying predetermined potentials to the wiring BL and the wiring SL. A current flowing between a source and a drain of the transistor M3 and the potential of the first terminal of the transistor M3 are determined by the potential of the gate of the transistor M3 and a potential of the second terminal of the transistor M3. Therefore, by reading a potential of the wiring RBL connected to the first terminal of the transistor M3, a potential held in the first terminal of the capacitor CB (or the gate of the transistor M3) can be read. That is, information written in the memory cell can be read on the basis of the potential held in the first terminal of the capacitor CB (or the gate of the transistor M3). Alternatively, it can be found whether information is written to the memory cell or not.

The memory cell included in the above-described memory device 300 is not limited to the memory cell 411B and the configuration of the circuit can be changed as appropriate.

Figure 10C:
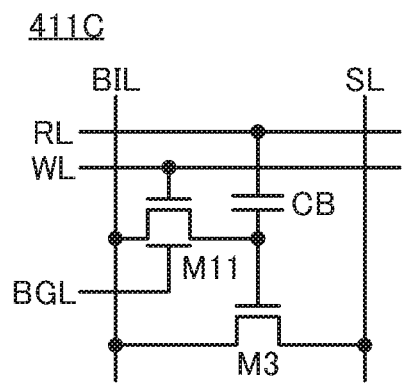

For example, a configuration in which the wiring WBL and the wiring RBL are made as one wiring BIL may be adopted. The circuit configuration example of such a memory cell is illustrated in FIG. 10(C). In the configuration of the memory cell 411C, the wiring WBL and the wiring RBL of the memory cell 411B are made as one wiring BIL and the second terminal of the transistor M11 and the first terminal of the transistor M3 are connected to the wiring BIL. In other words, the memory cell 411C operates with one wiring BIL serving as both a writing bit line and a read bit line.

An OS transistor is preferably used as the transistor M11 also in the memory cell 411B. A memory device including a 2Tr1C type memory cell using an OS transistor as the transistor M11, like the memory cell 411B and the memory cell 411C, is referred to as a non-volatile oxide semiconductor random access memory (NOSRAM).

In a channel formation region of the transistor M3, silicon is preferably included. In particular, the silicon can be amorphous silicon, polycrystalline silicon, or low-temperature poly-silicon (LTPS) (hereinafter, referred to as a Si transistor). Since a Si transistor has a higher field-effect mobility than that of the OS transistor in some cases, the Si transistor is preferably used as a reading transistor.

When an OS transistor is used as the transistor M3, the memory cell can be configured using a single-polarity circuit.

Figure 10D:
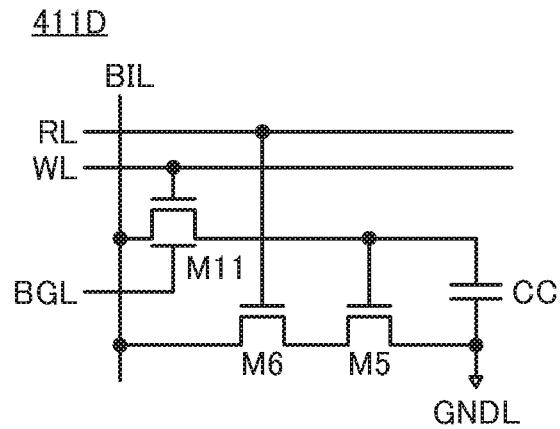

FIG. 10(D) illustrates a circuit configuration example of the memory cell 411D, which is a gain-cell type memory cell with three transistors and one capacitor (also referred to as a "3Tr1C type"). The memory cell 411D includes the transistor M11, a transistor M5, a transistor M6, and a capacitor CC.

The first terminal of the transistor M11 is connected to a first terminal of the capacitor CC. The second terminal of the transistor M11 is connected to the wiring BIL. The gate of the transistor M11 is connected to the wiring WL. The back gate of the transistor M11 is electrically connected to the wiring BGL. A second terminal of the capacitor CC is electrically connected to a first terminal of the transistor M5 and the wiring GNDL. A second terminal of the transistor M5 is connected to a first terminal of the transistor M6 and a gate of the transistor M5 is connected to the first terminal of the capacitor CC. A second terminal of the transistor M6 is connected to the wiring BIL and a gate of the transistor M6 is connected to the wiring RL.

The wiring BIL functions as a bit line. The wiring WL functions as a write word line. The wiring RL functions as a read word line.

The wiring BGL functions as a wiring for applying a potential to the back gate of the transistor M11. The wiring BGL is electrically connected to the output terminal VOUT of the semiconductor device 100. The threshold voltage of the transistor M11 can be increased or decreased by applying a given potential to the wiring BGL.

Data is written by applying a high-level potential to the wiring WL to bring the transistor M11 into a conductive state so that the wiring BIL is electrically connected to the first terminal of the capacitor CC. Specifically, when the transistor M11 is in the conductive state, a potential corresponding to information to be held is applied to the wiring BIL, and the potential is written to the first terminal of the capacitor CC and the gate of the transistor M5. Then, a low-level potential is applied to the wiring WL to bring the transistor M11 into a non-conductive state, and thereby, the potential of the first terminal of the capacitor CC and the potential of the gate of the transistor M5 are held.

Data is read by precharging the wiring BIL to a predetermined potential, and then making the wiring BIL to be electrically floating and applying a high-level potential to the wiring RL. Since the wiring RL has the high-level potential, the transistor M6 is brought into a conductive state, so that the wiring BIL is electrically connected to the second terminal of the transistor M5. At this time, the potential of the wiring BIL is applied to the second terminal of the transistor M5; however, the potential of the second terminal of the transistor M5 and the potential of the wiring BIL are changed depending on the potential held in the first terminal of the capacitor CC (or the gate of the transistor M5). Here, the potential held in the first terminal of the capacitor CC (or the gate of the transistor M5) can be read by reading the potential of the wiring BIL. That is, information written in the memory cell can be read on the basis of the potential held in the first terminal of the capacitor CC (or the gate of the transistor M5). Alternatively, it can be found whether information is written to the memory cell or not.

The circuit configuration of the memory cell included in the above-described memory device 300 can be changed as appropriate.

Note that also in the memory cell 411D, an OS transistor is preferably used as the transistor M11. The memory cell 411D of a 3Tr1C type, which includes the OS transistor as the transistor M11, is one kind of NOSRAM described above.

Note that channel formation regions of the transistors M5 and M6 described in this embodiment preferably include silicon. In particular, the silicon can be amorphous silicon, polycrystalline silicon, or low-temperature polysilicon. Since a Si transistor has a higher field-effect mobility than that of the OS transistor in some cases, the Si transistor is preferably used as a reading transistor.

When OS transistors are used as the transistors M5 and M6, the memory cell can be configured using a single-polarity circuit.

[oxSRAM]

Figure 10E:
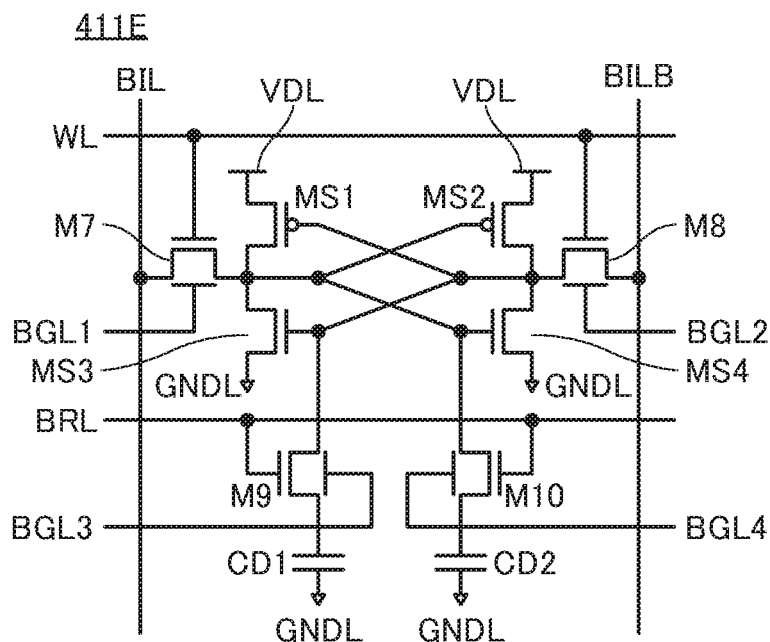

FIG. 10(E) illustrates a circuit configuration example of the memory cell 411E of a static random access memory (SRAM)-type including an OS transistor. In this specification and the like, an SRAM including an OS transistor is called oxSRAM. The memory cell 411E illustrated in FIG. 10(E) is an SRAM-type memory cell capable of a backup operation.

The memory cell 411E includes a transistor M7 to a transistor M10, a transistor MS1 to a transistor MS4, a capacitor CD1, and a capacitor CD2. The transistor M7 and the transistor M8 correspond to the transistor M11. The transistor M7 to the transistor M10 are transistors having back gates. The transistor MS1 and the transistor MS2 are p-channel transistors, and the transistor MS3 and the transistor MS4 are n-channel transistors.

A first terminal of the transistor M7 is electrically connected to the wiring BIL. A second terminal of the transistor M7 is connected to a first terminal of the transistor MS1, a first terminal of the transistor MS3, a gate of the transistor MS2, a gate of the transistor MS4, and a first terminal of the transistor M10. A gate of the transistor M7 is electrically connected to the wiring WL. A back gate of the transistor M7 is electrically connected to a wiring BGL1.

A first terminal of the transistor M8 is electrically connected to a wiring BILB. A second terminal of the transistor M8 is electrically connected to a first terminal of the transistor MS2, a first terminal of the transistor MS4, a gate of the transistor MS1, a gate of the transistor MS3, and a first terminal of the transistor M9. A gate of the transistor M8 is connected to the wiring WL and a back gate of the transistor M8 is connected to a wiring BGL2.

A second terminal of the transistor MS1 is electrically connected to a wiring VDL. A second terminal of the transistor MS2 is electrically connected to the wiring VDL. A second terminal of the transistor MS3 is electrically connected to the wiring GNDL. A second terminal of the transistor MS4 is connected to the wiring GNDL.

A second terminal of the transistor M9 is connected to a first terminal of the capacitor CD1. A gate of the transistor M9 is connected to a wiring BRL. A back gate of the transistor M9 is connected to a wiring BGL3. A second terminal of the transistor M10 is connected to a first terminal of the capacitor CD2. A gate of the transistor M10 is connected to the wiring BRL. A back gate of the transistor M10 is connected to a wiring BGL4.

A second terminal of the capacitor CD1 is connected to the wiring GNDL, and a second terminal of the capacitor CD2 is connected to the wiring GNDL.

The wiring BIL and the wiring BILB function as bit lines. The wiring WL functions as a word line. The wiring BRL is a wiring that controls conductive states and non-conductive states of the transistor M9 and the transistor M10.

The wiring BGL1 to the wiring BGL4 function as wirings for applying potentials to back gates of the transistor M7 to the transistor M10, respectively.

The wiring BGL1 to the wiring BGL4 are electrically connected to the output terminal VOUT of the semiconductor device 100. Note that a plurality of semiconductor devices 100 may be provided in the memory device 300 so that the wiring BGL1 to the wiring BGL4 are electrically connected to the different semiconductor devices 100. By applying arbitrary potentials to the wiring BGL1 to the wiring BGL4, each of the threshold voltages of the transistor M7 to the transistor M10 can be increased or decreased.

The wiring VDL is a wiring supplying a high-level potential. The wiring GNDL a wiring supplying a low-level potential.

Data writing is performed by applying a high-level potential to the wiring WL and applying a high-level potential to the wiring BRL. Specifically, when the transistor M10 is in a conductive state, a potential corresponding to information to be held is applied to the wiring BIL, and the potential is written to the second terminal side of the transistor M10.

In the memory cell 411E, the transistor MS1 to the transistor MS2 form an inverter loop. Thus, an inversion signal of a data signal corresponding to the potential is input to the second terminal side of the transistor M8. Since the transistor M8 is in a conductive state, an inversion signal of the potential that has been applied to the wiring BIL, i.e., the signal that has been input to the wiring BIL, is output to the wiring BILB. Since the transistor M9 and the transistor M10 are in conductive states, a potential of the second terminal of the transistor M7 and a potential of the second terminal of the transistor M8 are held at the first terminal of the capacitor CD2, and the first terminal of the capacitor CD1, respectively. After that, a low-level potential is applied to the wiring WL and a low-level potential is applied to the wiring BRL to bring the transistor M7 to the transistor M10 into non-conductive states, whereby the potential of the first terminal of the capacitor CD1 and the potential of the first terminal of the capacitor CD2 are held.

Data reading is performed in such a manner that the wiring BIL and the wiring BILB are precharged to predetermined potentials, a high-level potential is applied to the wiring WL and a high-level potential is applied to the wiring BRL, and a potential of the first terminal of the capacitor CD1 is refreshed by the inverter loop in the memory cell 411E and output to the wiring BILB. Furthermore, a potential of the first terminal of the capacitor CD2 is refreshed by the inverter loop in the memory cell 411E and output to the wiring BIL. Since the wiring BIL and the wiring BILB are changed from the precharged potentials to the potential of the first terminal of the capacitor CD2 and the potential of the first terminal of the capacitor CD1, respectively, the potential held in the memory cell can be read on the basis of the potentials of the wiring BIL and the wiring BILB.

Note that OS transistors are preferably used as the transistor M7 to the transistor M10. The use of OS transistors as the transistor M7 to the transistor M10 can hold data written to the memory cell 411E for a long time, so that the refresh frequency of the memory cell 411E can be reduced. In addition, the refresh operation for the memory cell 411E can be unnecessary. In addition, owing to the extremely low leakage current, it is possible for the memory cell 411E to hold multilevel data or analog data.

Note that channel formation regions of the transistor MS1 to the transistor MS4 preferably include silicon. In particular, the silicon, the silicon can be amorphous silicon, polycrystalline silicon, or low-temperature polysilicon. Since a Si transistor has a higher field-effect mobility than that of the OS transistor in some cases, the Si transistor is preferably used as the transistors included in the inverter.

In addition, when an OS transistor is used in the memory cell, information written to the memory cell can be held for a long period of time even when power supply to the memory cell is stopped. Thus, the power supply to part or the whole of the peripheral circuit 311 can be stopped during a period in which write and read of information is not needed.

One semiconductor device 100 may be electrically connected to all the memory cells. Alternatively, a plurality of semiconductor devices 100 may be provided in the memory device 300 and a plurality of memory cells may be electrically connected to the one semiconductor device 100 for every column or every plural columns. Alternatively, a plurality of memory cells may be electrically connected to the one semiconductor device 100 for every one row or every plural rows. Furthermore, the plurality of memory cells included in the cell array may be divided into a plurality of blocks and one semiconductor device 100 may be provided every one block or every some blocks.

The memory cell described in this embodiment can be used as a memory element such as a register or a cache, included in a CPU, a GPU, or the like.

This embodiment can be implemented in combination with any of the structures described in the other embodiments and the like, as appropriate.

Embodiment 3

In this embodiment, a cross-sectional structure example of the memory device 300 is described with reference to the drawings.

<Structure Example of Memory Device>

Figure 11:
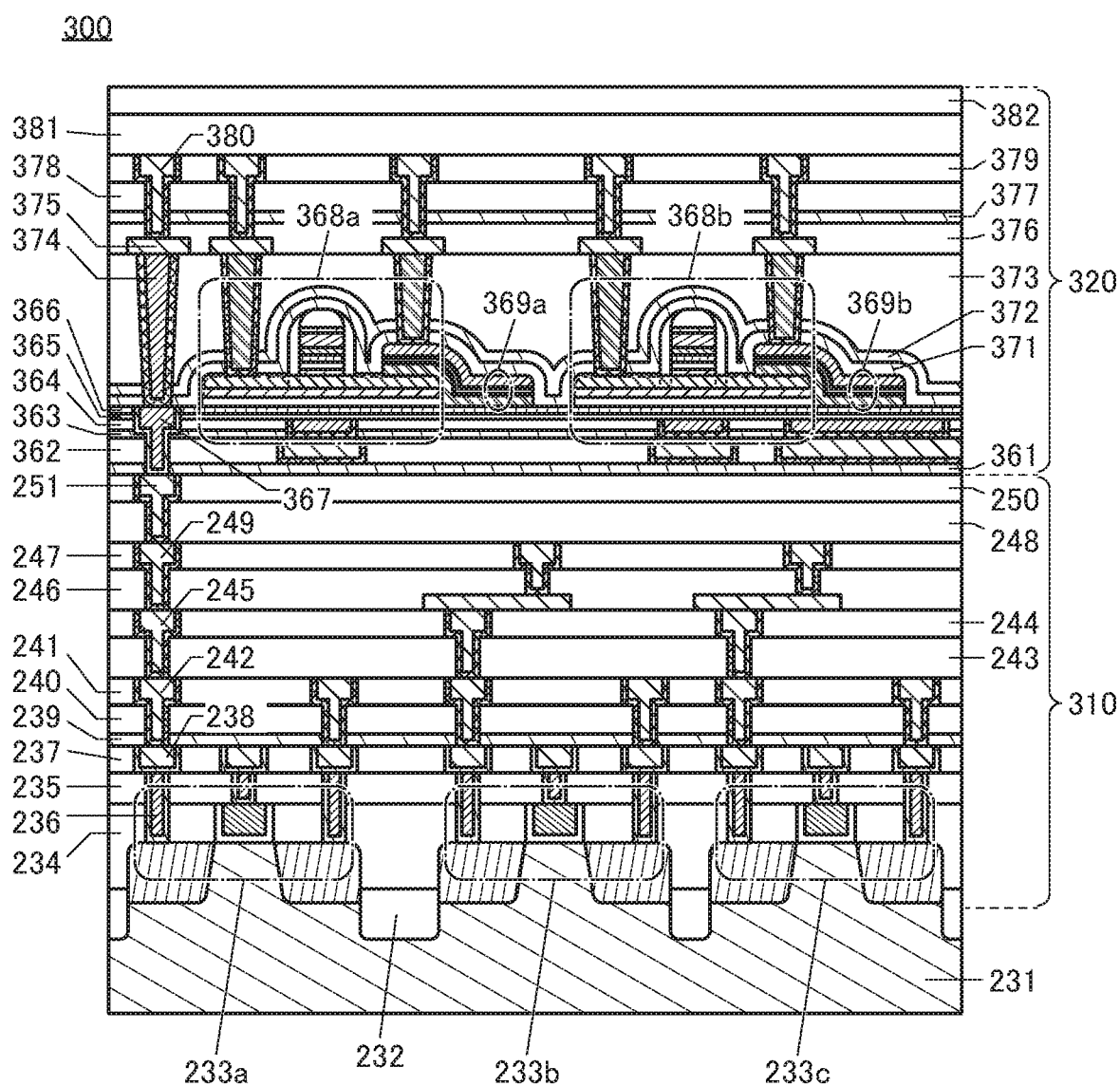
FIG. 11A diagram illustrating a configuration example of a memory device.

FIG. 11 illustrates a cross section of part of the memory device 300. A layer 310 and a layer 320 are stacked over a substrate 231 in the memory device 300 illustrated in FIG. 11. FIG. 11 illustrates a case where a single crystal semiconductor substrate (e.g., a single crystal silicon substrate) is used as the substrate 231.

[Layer 310] The layer 310 in FIG. 11 includes, over the substrate 231, a transistor 233a, a transistor 233b, and a transistor 233c. FIG. 11 illustrates cross sections of the transistor 233a, the transistor 233b, and the transistor 233c in the channel length direction.

Channels of the transistor 233a, the transistor 233b, and the transistor 233c are formed in part of the substrate 231. When an integrated circuit is required to operate at high speed, a single crystal semiconductor substrate is preferably used as the substrate 231.

The transistor 233a, the transistor 233b, and the transistor 233c are electrically isolated from each other by an element isolation layer 232. The element isolation layer can be formed by a local oxidation of silicon (LOCOS) method, a shallow trench isolation (STI) method, or the like.

An insulating layer 234 is provided over a substrate 231 and an insulating layer 235 and an insulating layer 237 are provided over the transistor 233a, the transistor 233b, and the transistor 233c, and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Layer 320]

The layer 320 is provided over the layer 310. The layer 320 includes a transistor 368a, a transistor 368b, a capacitor 369a, and a capacitor 369b. FIG. 11 illustrates cross sections of the transistor 368a and the transistor 368b in the channel length direction. The transistor 368a and the transistor 368b are transistors having back gates.

The transistor 368a and the transistor 368b correspond to the transistor M11 described in the above embodiment. It is preferable that an oxide semiconductor, which is one kind of metal oxide, be used for the semiconductor layers of the transistor 368a and the transistor 368b. That is, an OS transistor is preferably used as the transistor 368a and the transistor 368b.

The transistor 368a and the transistor 368b are provided over an insulating layer 361 and an insulating layer 362. An insulating layer 363 and an insulating layer 364 are provided over the insulating layer 362. The back gates of the transistor 368a and the transistor 368b are embedded in the insulating layer 363 and the insulating layer 364. An insulating layer 365 and an insulating layer 366 are provided over the insulating layer 364. An electrode 367 is embedded in the insulating layer 361 to the insulating layer 366. The electrode 367 is electrically connected to the electrode 251.

An insulating layer 371, an insulating layer 372, and an insulating layer 373 are formed over the transistor 368a, the transistor 368b, the capacitor 369a, and the capacitor 369b, and an electrode 375 is formed over the insulating layer 373. The electrode 375 is electrically connected to the electrode 367 through a contact plug 374.

An insulating layer 376, an insulating layer 377, an insulating layer 378, and an insulating layer 379 are provided over the electrode 375. An electrode 380 is embedded in the insulating layer 376 to the insulating layer 379. The electrode 380 is electrically connected to the electrode 375.

In addition, an insulating layer 381 and an insulating layer 382 are provided over the electrode 380 and the insulating layer 379.

Modification Example

Figure 12:
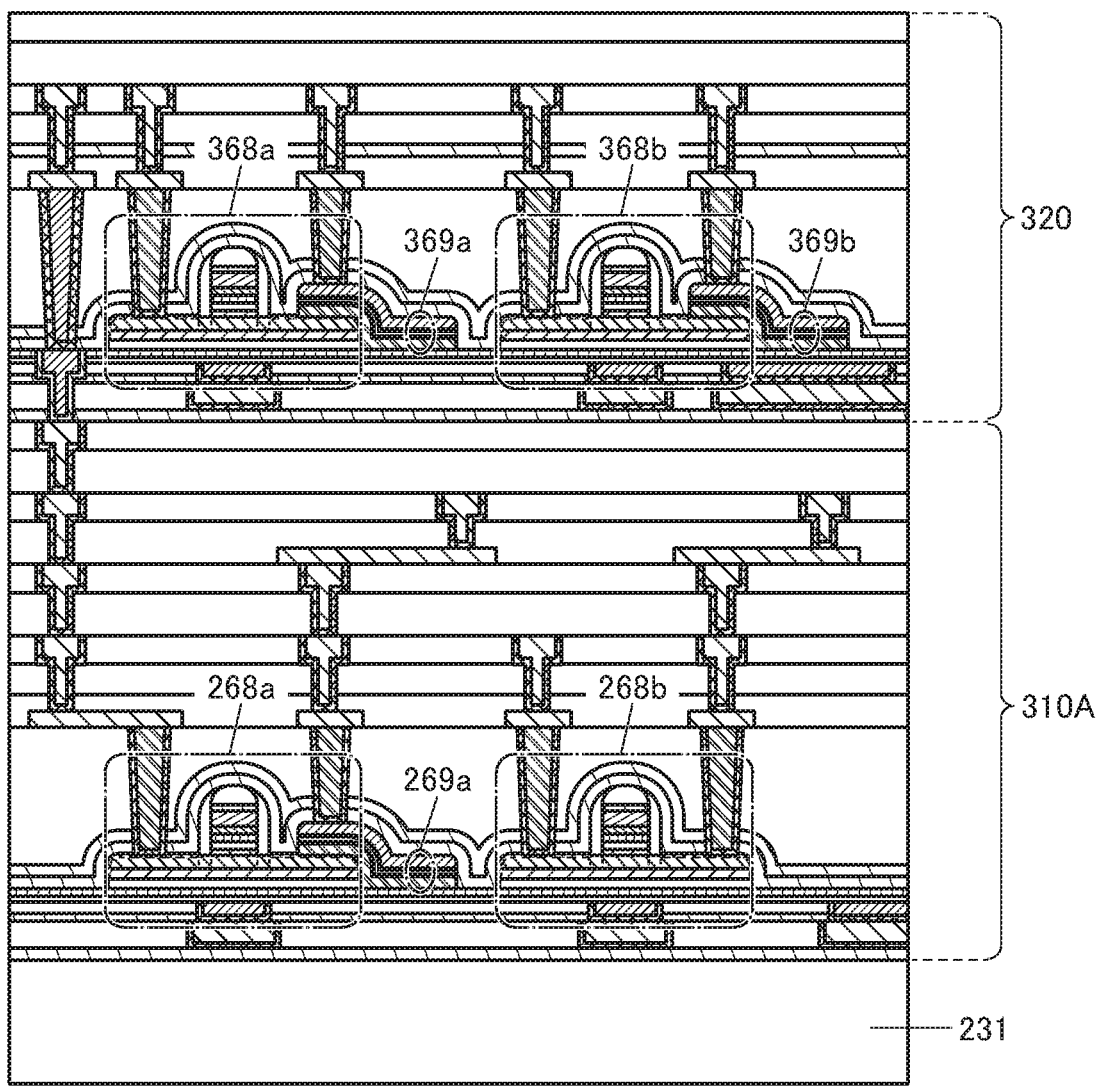
FIG. 12A diagram illustrating a configuration example of a memory device.

FIG. 12 illustrates a cross section of part of a memory device 300A. The memory device 300A is a modification example of the memory device 300. The memory device 300A includes a layer 310A and the layer 320. An insulating substrate (e.g., a glass substrate) is used as the substrate 231 of the memory device 300A.

The layer 310A includes a transistor 268a, a transistor 268b, and a capacitor 269a. A thin film transistor (e.g., an OS transistor) is used as the transistor in the layer 310A. All the transistors included in the layer 310A are OS transistors, whereby the layer 310A can be a single-polarity integrated circuit. All the transistors included in the memory device 300A are OS transistors, whereby the memory device 300A can be a single-polarity memory device.

<Constituent Materials>

[Substrate]

There is no particular limitation on a material used for the substrate but the material is required to have heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. That is, the substrate is not limited to a simple supporting substrate, and may be a substrate where a device such as another transistor is formed.

Still alternatively, as the substrate, a glass substrate of barium borosilicate glass, aluminoborosilicate glass, or the like, a ceramic substrate, a quartz substrate, a sapphire substrate, or the like can be used. Note that a flexible substrate may be used as the substrate. In the case where a flexible substrate is used, a transistor, a capacitor, or the like may be directly formed over the flexible substrate; or a transistor, a capacitor, or the like may be formed over another manufacturing substrate and then separated and transferred onto the flexible substrate. To separate and transfer from the manufacturing substrate to the flexible substrate, a separation layer is preferably provided between the manufacturing substrate and the transistor, the capacitor, or the like.

For the flexible substrate, for example, metal, an alloy, resin, glass, or fiber thereof can be used. The flexible substrate used as the substrate preferably has a lower coefficient of linear expansion because deformation due to an environment is suppressed. As the flexible substrate used as the substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K may be used. As the resin, polyester, polyolefin, polyamide (e.g., nylon and aramid), polyimide, polycarbonate, acrylic, and the like are given, for example. In particular, aramid is preferably used for the flexible substrate because of its low coefficient of linear expansion.

[Insulating Layer]

The insulating layer is formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which a plurality of materials selected from an oxide material, a nitride material, an oxynitride material, and a nitride oxide material are mixed may be used.

Note that in this specification and the like, a nitride oxide refers to a compound that contains more nitrogen than oxygen. An oxynitride refers to a compound that contains more oxygen than nitrogen. The content of each element can be measured by Rutherford backscattering spectrometry (RBS) or the like, for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer that is measured by secondary ion mass spectrometry (SIMS) is set lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer that is measured by SIMS is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable that a region of the insulating layer that is in contact with at least the semiconductor layer have few defects and typically have as few signals observed by electron spin resonance (ESR) spectroscopy as possible. As the above signals, a signal due to an E' center observed at a g-factor of 2.001 is given. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ may be used.

In addition to the above-described signal, a signal due to nitrogen dioxide (NO$_2$) might be observed. The signal is divided into three signals according to the N nuclear spin; a signal observed at a g-factor of greater than or equal to 2.037 and less than or equal to 2.039 (first signal), a signal observed at a g-factor of greater than or equal to 2.001 and less than or equal to 2.003 (a second signal), and a signal observed at a g-factor of greater than or equal to 1.964 and less than or equal to 1.966 (a third signal).

It is suitable to use an insulating layer whose spin density of a signal due to nitrogen dioxide (NO$_2$) is higher than or equal to $1\times10^{17}$ spins/cm$^3$ and lower than $1\times10^{18}$ spins/cm$^3$, for example.

Note that nitrogen oxide (NO)) such as nitrogen dioxide (NO$_2$) forms a state in the insulating layer. The state is positioned in the energy gap of the oxide semiconductor layer. Thus, when nitrogen oxide (NO)) is diffused to the interface between the insulating layer and the oxide semiconductor layer, an electron can be trapped by the state on the insulating layer side. As a result, the trapped electrons remain in the vicinity of the interface between the insulating layer and the oxide semiconductor layer; thus, the threshold voltage of the transistor shifts in the positive direction. Therefore, a shift in the threshold voltage of the transistor can be reduced when a film with a low nitrogen oxide content is used as the insulating layer.

As an insulating layer that releases little nitrogen oxide (NO)), for example, a silicon oxynitride layer can be used. The silicon oxynitride layer is a film that releases more ammonia than nitrogen oxide (NO)) in thermal desorption spectroscopy (TDS); typically the released amount of ammonia is greater than or equal to $1\times10^{18}$/cm$^3$ and less than or equal to $5\times10^{19}$/cm$^3$. Note that the amount of released ammonia is the total amount of ammonia released by heat treatment in a range from 50° C. to 650° C. or a range from 50° C. to 550° C. in TDS.

Since nitrogen oxide (NO)) reacts with ammonia and oxygen in heat treatment, the use of an insulating layer that releases a large amount of ammonia reduces nitrogen oxide (NO)).

At least one of the insulating layers in contact with the oxide semiconductor layer is preferably formed using an insulating layer from which oxygen is released by heating. Specifically, it is preferable to use an insulating layer of which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed at the heat treatment under such a condition that the surface temperature of the insulating layer is a temperature higher than or equal to 100° C. and lower than or equal to 700° C., preferably higher than or equal to 100° C. and lower than or equal to 500° C. Note that in this specification and the like, oxygen released by heating is also referred to as "excess oxygen".

The insulating layer containing excess oxygen can be formed also by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. As a gas used for the treatment for adding oxygen, an oxygen gas such as $^{16}O_2$ or $^{18}O_2$ and a gas containing oxygen such as a nitrous oxide gas or an ozone gas are given. In this specification, the treatment for adding oxygen is also referred to as "oxygen doping treatment". The oxygen doping treatment may be performed, heating the substrate.

A heat-resistant organic material such as polyimide, an acrylic-based resin, a benzocyclobutene-based resin, polyamide, or an epoxy-based resin can be used for the insulating layer. Other than the above organic materials, a low-dielectric constant material (low-k material), a siloxane-based resin, phosphosilicate glass (PSG), borophosphosilicate glass (BPSG), or the like can be used. Note that the insulating layer may be formed by stacking a plurality of insulating layers formed with any of these materials.

Note that the siloxane-based resin corresponds to a resin including a Si—O—Si bond formed using a siloxane-based material as a starting material. The siloxane-based resin may use, as a substituent, an organic group (e.g., an alkyl group or an aryl group) or a fluoro group. The organic group may contain a fluoro group.

There is no particular limitation on the method for forming the insulating layer. Note that a baking step is necessary in some cases depending on a material used for the insulating layer. When the baking step of the insulating layer also serves as another heat treatment step, the transistor can be manufactured efficiently.

[Electrode]

As a conductive material for forming the electrode, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used.

Alternatively, a semiconductor having high electric conductivity, typified by polycrystalline silicon containing an impurity element such as phosphorus, or silicide such as nickel silicide may be used.

A conductive material containing the above metal element and oxygen may be used. A conductive material containing the above metal element and nitrogen may also be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Indium gallium zinc oxide containing nitrogen may be used.

A plurality of conductive layers formed using the above material may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Further alternatively, a stacked-layer structure combining a material containing any of the above metal elements, a conductive material containing oxygen, and a conductive material containing nitrogen may be used. Still further alternatively, a stacked-layer structure combining a conductive material containing nitrogen and a conductive material containing oxygen may be used.

Note that in the case where an oxide semiconductor is used for the semiconductor layer and a stacked-layer structure combining a material containing any of the above metal elements and a conductive material containing oxygen is used as the gate electrode, the conductive material containing oxygen is preferably provided on the semiconductor layer side. By providing the conductive material containing oxygen on the semiconductor layer side, oxygen released from the conductive material is likely to be supplied to the semiconductor layer.

As the electrode, a conductive material with high embeddability, such as tungsten or polysilicon may be used, for example. A conductive material with high embeddability and a barrier layer (diffusion prevention layer) such as a titanium layer, a titanium nitride layer, or a tantalum nitride layer may be used in combination. Note that the electrode may be referred to as a "contact plug".

In particular, a conductive material that is relatively impermeable to impurities is preferably used for the electrode in contact with a gate insulating layer. As an example of the conductive material that is relatively impermeable to impurities, tantalum nitride is given, for example.

When an insulating material that is relatively impermeable to impurities is used for the insulating layer, and a conductive material that is relatively impermeable to impurities is used for the electrode, diffusion of impurities to the transistor can be further suppressed. Thus, the reliability of the transistor can be further increased, that is, the reliability of the memory device can be further increased.

[Semiconductor Layer]

For the semiconductor layer, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene, or the like can be used.

Note that semiconductor layer may be layered. In this case, when the semiconductor layer is layered, semiconductors having different crystal states or different semiconductor materials may be used.

The band gap of an oxide semiconductor, one of metal oxides, is greater than or equal to 2 eV; thus, when the oxide semiconductor is used for the semiconductor layer, a transistor with an extremely low off-state current can be realized. Specifically, the off-state current per micrometer in channel width at room temperature (typically 25° C.) and at a source-drain voltage of 3.5 V can be lower than $1\times10^{-20}$ A, lower than $1\times10^{-22}$ A, or lower than $1\times10^{-24}$ A. That is, the on/off ratio can be greater than or equal to 20 digits. A transistor using an oxide semiconductor for the semiconductor layer (OS transistor) has high withstand voltage between a source and a drain. Thus, a transistor with high reliability can be provided. Furthermore, a transistor with high output voltage and high withstand voltage can be provided. Furthermore, a memory device or the like with high reliability can be provided. Furthermore, a memory device with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor layer be selected depending on the purpose and the use. For example, depending on the purpose and the use, the OS transistor and the crystalline Si transistor may be used in combination.

In the case where the semiconductor layer is formed using an oxide semiconductor layer, the oxide semiconductor layer is preferably formed by a sputtering method. The oxide semiconductor layer is preferably formed by a sputtering method, in which case the oxide semiconductor layer can have high density. In the case where the oxide semiconductor layer is formed by a sputtering method, a rare gas (typically argon), oxygen, or a mixed gas of a rare gas and oxygen may be used as a sputtering gas. In addition, increasing the purity of the sputtering gas is necessary. For example, as an oxygen gas or a rare gas used as a sputtering gas, a gas that is highly purified to have a dew point of −60° C. or lower, preferably −100° C. or lower is used. By using the sputtering gas that is highly purified, entry of moisture or the like into the oxide semiconductor layer can be prevented as much as possible.

In the case where an oxide semiconductor layer is formed by a sputtering method, it is preferable that moisture in a deposition chamber included in a sputtering apparatus be removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

An oxide semiconductor that is one kind of metal oxides preferably contains at least indium or zinc. In particular, indium and zinc are preferably contained. In addition, aluminum, gallium, yttrium, tin, or the like is preferably contained.

Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that a plurality of elements of the above elements can be used in combination as the element Min some cases.

Note that in this specification and the like, a metal oxide containing nitrogen is also referred to as a metal oxide in some cases. A metal oxide containing nitrogen may be referred to as a metal oxynitride.

[Composition of Metal Oxide]

The composition of a cloud-aligned composite (CAC)—OS that can be used for a transistor disclosed in one embodiment of the present invention will be described below.

In this specification and the like, "c-axis aligned crystal (CAAC)" or "cloud-aligned composite (CAC)" is stated in some cases. Note that CAAC refers to an example of a crystal structure, and CAC refers to an example of a function or a material composition.

A CAC-OS or a CAC-metal oxide has a conducting function in a part of the material and has an insulating function in a part of the material; as a whole, the CAC-OS or the CAC-metal oxide has a function of a semiconductor. In the case where the CAC-OS or the CAC metal oxide is used in an active layer of a transistor, the conducting function is to allow electrons (or holes) functioning as carriers to flow, and the insulating function is to not allow electrons functioning as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide is composed of components having different bandgaps. For example, the CAC-OS or the CAC-metal oxide is composed of a component having a wide gap due to the insulating region and a component having a narrow gap due to the conductive region. In the case of such a composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, a high on-state current and high field-effect mobility, can be obtained.

In other words, the CAC-OS or the CAC-metal oxide can also be referred to as a matrix composite or a metal matrix composite.

[Structure of Metal Oxide]

An oxide semiconductor, which is one type of metal oxide, is classified into a single crystal oxide semiconductor and a non-single-crystal oxide semiconductor. Examples of a non-single-crystal oxide semiconductor are a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), an amorphous oxide semiconductor, and the like.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as grain boundary) even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can also be referred to as an (In, M, Zn) layer. When indium of the In layer is replaced with the element M, the layer can also be referred to as an (In, M) layer.

The CAAC-OS is a metal oxide with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of a metal oxide. Thus, it can be said that the CAAC-OS is a metal oxide having small amounts of impurities and defects (e.g., oxygen vacancies). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

The a-like OS is a metal oxide having a structure between that of the nc-OS and that of the amorphous oxide semiconductor. The a-like OS has a void or a low-density region.

That is, the a-like OS has low crystallinity as compared with the nc-OS and the CAAC-OS.

An oxide semiconductor (metal oxide) can have various structures that show various different properties. Two or more of an amorphous oxide semiconductor, a polycrystalline oxide semiconductor, an a-like OS, an nc-OS, and a CAAC-OS may be included in an oxide semiconductor.

[Transistor Including Metal Oxide]

Next, the case where the metal oxide is used for a channel formation region of a transistor is described.

When the metal oxide is used for a channel formation region of a transistor, the transistor can have high field-effect mobility. In addition, the transistor can have high reliability.

Moreover, a metal oxide with low carrier density is preferably used for the transistor. In order to reduce the carrier density of the metal oxide film, the concentration of impurities in the metal oxide film may be reduced to reduce the density of defect states. In this specification and the like, a state with a low impurity concentration and a low density of defect states is referred to as a highly purified intrinsic or substantially highly purified intrinsic state. The metal oxide has, for example, a carrier density lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

A highly purified intrinsic or substantially highly purified intrinsic metal oxide film has a low density of defect states and accordingly has a low density of trap states in some cases.

Charges trapped by the trap states in the metal oxide take a long time to disappear and behave like fixed charges in some cases. Thus, a transistor including the metal oxide having a high density of trap states in the channel formation region has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in an adjacent film is preferably reduced. As impurities, hydrogen, nitrogen, alkali metal, alkaline earth metal, iron, nickel, silicon, and the like are given.

[Impurity]

Here, the influence of impurities in the metal oxide is described.

When silicon or carbon that is one of Group 14 elements is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set to lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor including, in a channel formation region, a metal oxide that contains an alkali metal or an alkaline earth metal is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

When the metal oxide contains nitrogen, the metal oxide easily becomes n-type by generation of electrons functioning as carriers and an increase of carrier density. Thus, a transistor whose channel formation region includes a metal oxide containing nitrogen is likely to have normally-on characteristics. Thus, the nitrogen in the metal oxide contained in the channel formation region is preferably reduced as much as possible. For example, the concentration of nitrogen in the metal oxide measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in the metal oxide reacts with oxygen bonded to a metal atom to be water, and thus sometimes causes oxygen vacancies. Entry of hydrogen into the oxygen vacancies generates electrons serving as carriers in some cases. Furthermore, some hydrogen may react with oxygen bonded to a metal atom and generate an electron serving as a carrier. Thus, a transistor including the metal oxide that contains hydrogen for a channel formation region is likely to have normally-on characteristics. For this reason, hydrogen in the metal oxide is preferably reduced as much as possible. Specifically, the hydrogen concentration of the metal oxide measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When a metal oxide with sufficiently reduced impurity concentration is used for a channel formation region in a transistor, the transistor can have stable electrical characteristics.

<Deposition Method>

Insulating materials for forming the insulating layers, conductive materials for forming the electrodes, or semiconductor materials for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, a pulsed laser deposition (PLD) method, a dipping method, a spray coating method, a droplet discharge method (such as an inkjet method), or a printing method (such as screen printing or offset printing).

A high-quality film can be obtained at a relatively low temperature by a plasma CVD method. By using a deposition method that does not use plasma for deposition, such as an MOCVD method, an ALD method, or a thermal CVD method, damage is not easily caused on a surface on which the film is deposited. For example, a wiring, an electrode, an element (such as a transistor or a capacitor), or the like included in a memory device might be charged up by receiving charges from plasma. In that case, accumulated charges might break the wiring, electrode, element, or the like included in the memory device. Such plasma damage is not caused in the case of using a deposition method without using plasma, and thus the yield of a memory device can be increased. In addition, since plasma damage is not caused in the deposition, a film with few defects can be obtained.

Unlike in the deposition method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method allows excellent step coverage and excellent thickness uniformity and can be suitable for a case where a surface of an opening portion with a high aspect ratio is covered, and the like. Note that an ALD method has a relatively low deposition rate; hence, in some cases, an ALD method is preferably combined with another deposition method with a high deposition rate, such as a CVD method.

A CVD method or an ALD method enables the composition of a film to be formed to be controlled with the flow rate ratio of the source gases. For example, in a CVD method or an ALD method, a film with an arbitrary composition can be formed by adjusting the flow rate ratio of the source gases. Moreover, in a CVD method or an ALD method, by changing the flow rate ratio of the source gases during the film formation, a film whose composition is continuously changed can be formed. In the case where the film is formed while changing the flow rate ratio of the source gases, as compared with the case where the film is formed using a plurality of deposition chambers, time taken for the film formation can be reduced because time taken for transfer and pressure adjustment is omitted. Thus, memory devices can be manufactured with improved productivity.

In the case where a film is formed by an ALD method, a gas that does not contain chlorine is preferably used as a material gas.

This embodiment can be implemented in combination with any of the structures described in the other embodiments and the like, as appropriate.

Embodiment 4

Figure 13A:
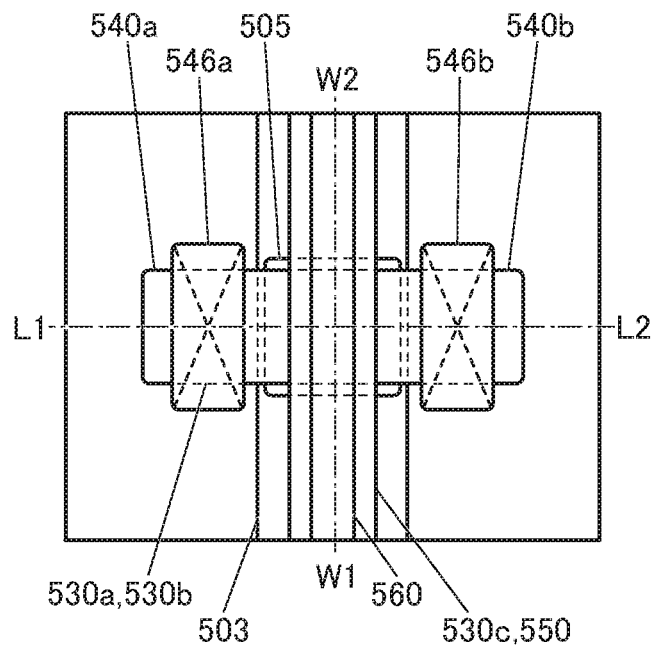
FIGS. 13A to 13C Diagrams illustrating a configuration example of a transistor.
Figure 13C:
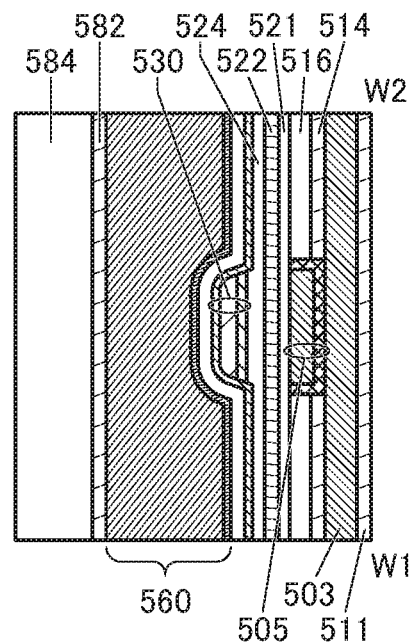
Figure 13B:
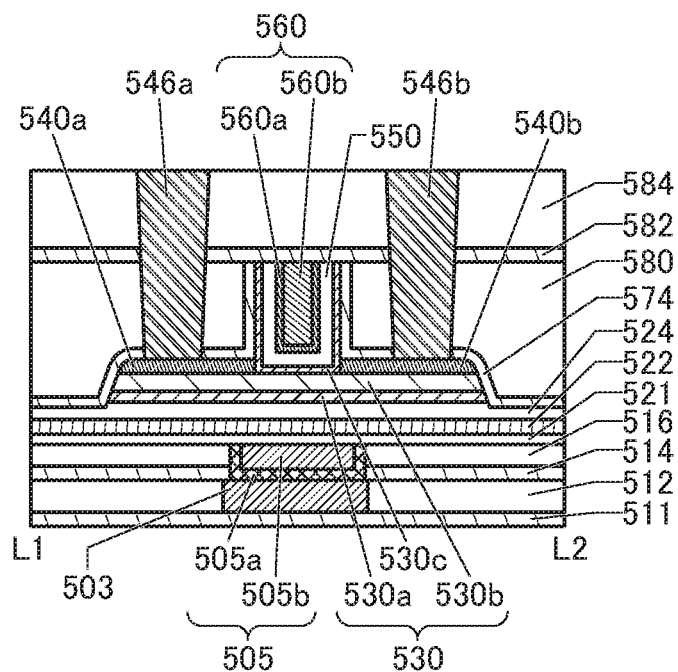

In this embodiment, a structure example of a transistor that can be used for the semiconductor device or the like described in the above embodiment will be described.
<Structural Example 1 of Transistor>
A structure example of a transistor 510 is described with reference to FIGS. 13(A), 13(B), and 13(C). FIG. 13(A) is a top view of the transistor 510. FIG. 13(B) is a cross-sectional view of a portion along the dashed-dotted line L1-L2 in FIG. 13(A). FIG. 13(C) is a cross-sectional view of a portion along the dashed-dotted line W1-W2 in FIG. 13(A). Note that for simplification of the drawing, some components are not illustrated in the top view in FIG. 13(A).

FIGS. 13(A), 13(B), and 13(C) illustrate the transistor 510, and an insulating layer 511, an insulating layer 512, an insulating layer 514, an insulating layer 516, an insulating layer 580, an insulating layer 582, and an insulating layer 584 functioning as interlayer films. In addition, a conductive layer 546 (a conductive layer 546a and a conductive layer 546b) serving as a contact plug and a conductive layer 503 serving as a wiring, which are electrically connected to the transistor 510, are illustrated.

The transistor 510 includes a conductive layer 560 (a conductive layer 560a and a conductive layer 560b) serving as a first gate electrode, a conductive layer 505 (a conductive layer 505a and a conductive layer 505b) serving as a second gate electrode, an insulating layer 550 serving as a first gate insulating film, an insulating layer 521 an insulating layer 522, and an insulating layer 524 serving as a second gate insulating layer, an oxide 530 (an oxide 530a, an oxide 530b, and an oxide 530c) having a region where a channel is formed, a conductive layer 540a serving as one of a source and a drain, a conductive layer 540b serving as the other of the source and the drain, and an insulating layer 574.

In the transistor 510 illustrated in FIG. 13, the oxide 530c, the insulating layer 550, and the conductive layer 560 are disposed in an opening provided in the insulating layer 580 with the insulating layer 574 positioned therebetween. In addition, the oxide 530c, the insulating layer 550, and the conductive layer 560 are provided between the conductive layer 540a and the conductive layer 540b.

The insulating layer 511 and the insulating layer 512 serve as interlayer films.

A single-layer structure or a stacked-layer structure using an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the interlayer film. Alternatively, aluminum oxide, bismuth oxide, germanium oxide, niobium oxide, silicon oxide, titanium oxide, tungsten oxide, yttrium oxide, or zirconium oxide may be added to such an insulator, for example. Alternatively, the insulators may be subjected to nitriding treatment. Silicon oxide, silicon oxynitride, or silicon nitride may be stacked over the insulator described above.

For example, the insulating layer 511 preferably functions as a barrier film for inhibiting impurities such as water or hydrogen from entering the transistor 510 from the substrate side. Accordingly, as the insulating layer 511, an insulating material having a function of inhibiting diffusion of impurities such as a hydrogen atom, a hydrogen molecule, a water molecule, and a copper atom (through which the above impurities do not easily pass) is preferably used. Alternatively, an insulating material having a function of inhibiting diffusion of oxygen (e.g., at least one of oxygen atoms, oxygen molecules, and the like) (through which the oxygen does not easily pass) is preferably used. Further, aluminum oxide, silicon nitride, or the like for example, may be used for the insulating layer 511. With such a structure, impurities such as hydrogen or water can be prevented from diffusing into the transistor 510 from the substrate side through the insulating layer 511.

For example, the dielectric constant of the insulating layer 512 is preferably lower than that of the insulating layer 511. The use of a material having a low dielectric constant for the interlayer film can reduce the parasitic capacitance between wirings.

The conductive layer 503 is formed to be embedded in the insulating layer 512. Here, the top surface of the conductive layer 503 and the top surface of the insulating layer 512 can be at substantially the same level. Note that the conductive layer 503 having a single-layer structure is shown; however, the present invention is not limited thereto. For example, the conductive layer 503 may have a multilayer structure of two or more layers. The conductive layer 503 is preferably formed using a conductive material that has high conductivity and contains tungsten, copper, or aluminum as its main component.

The conductive layer 560 in the transistor 510 functions as a first gate (also referred to as a top gate) electrode in some cases. In addition, the conductive layer 505 functions as a second gate (also referred to as a bottom gate) electrode in some cases. In that case, by changing a potential supplied to the conductive layer 505 not in conjunction with but independently from a potential supplied to the conductive layer 560, the threshold voltage of the transistor 510 can be controlled. In particular, by applying a negative potential to the conductive layer 505, the threshold voltage of the transistor 510 can be higher than 0 V, and the off-state current can be reduced. Thus, a drain current when a potential supplied to the conductive layer 560 is 0 V can be smaller in the case where a negative potential is supplied to the conductive layer 505 than in the case where the negative potential is not supplied to the conductive layer 505.

For example, by provision of the conductive layer 505 and the conductive layer 560 overlapping with each other, in the case where a potential is applied to the conductive layer 560 and the conductive layer 505, an electric field generated from the conductive layer 560 and an electric field generated from the conductive layer 505 can be connected to cover the channel formation region formed in the oxide 530.

That is, the channel formation region can be electrically surrounded by the electric field of the conductive layer 560 functioning as the first gate electrode and the electric field of the conductive layer 505 functioning as the second gate electrode. In this specification, such a transistor structure in which the channel formation region is electrically surrounded by the electric fields of the first gate electrode and the second gate electrode is referred to as surrounded channel (s-channel) structure.

Like the insulating layer 511 and the insulating layer 512, the insulating layer 514 and the insulating layer 516 function as interlayer films. For example, the insulating layer 514 preferably functions as a barrier film for inhibiting impurities such as water or hydrogen from entering the transistor 510 from the substrate side. With this structure, impurities such as hydrogen or water can be prevented from diffusing into the transistor 510 side from the substrate side through the insulating layer 514. Moreover, for example, the insulating layer 516 preferably has a lower dielectric constant than the insulating layer 514. The use of a material having a low dielectric constant for the interlayer film can reduce the parasitic capacitance between wirings.

The conductive layer 505 functioning as the second gate is formed in such a manner that the conductive layer 505*a* is formed in contact with an inner wall of an opening of the insulating layer 514 and the insulating layer 516, and the conductive layer 505*b* is formed on the inner side. Here, the level of top surfaces of the conductive layer 505*a* and the conductive layer 505*b* can be at substantially the same as the level of a top surface of the insulating layer 516. Although the conductive layer 505*a* and the conductive layer 505*b* are stacked in the transistor 510, the present invention is not limited thereto. For example, the conductive layer 505 may have a single-layer structure or a stacked-layer structure of three or more layers.

As the conductive layer 505*a*, a conductive material having a function of inhibiting diffusion of impurities such as a hydrogen atom, a hydrogen molecule, a water molecule, and a copper atom (through which the above impurities do not easily pass) is preferably used. Alternatively, a conductive material having a function of inhibiting diffusion of oxygen (e.g., at least one of oxygen atoms, oxygen molecules, and the like) (through which the above oxygen does not easily pass) is preferably used. Note that in this specification, a function of inhibiting diffusion of impurities or oxygen means a function of inhibiting diffusion of any one or all of the above impurities and the above oxygen.

For example, when the conductive layer 505*a* has a function of inhibiting diffusion of oxygen, the conductivity of the conductive layer 505*b* can be prevented from being lowered because of being oxidized.

In the case where the conductive layer 505 functions as a wiring, the conductive layer 505*b* is preferably formed using a conductive material with high conductivity that contains tungsten, copper, or aluminum as its main component. In that case, the conductive layer 503 is not necessarily provided. Note that the conductive layer 505*b* is a single layer in the drawing but may have a stacked-layer structure, for example, a stacked-layer structure of titanium or titanium nitride and any of the above conductive materials.

The insulating layer 521, the insulating layer 522, and the insulating layer 524 function as a second gate insulator.

The insulating layer 522 preferably has a barrier property. The insulating layer 522 having a barrier property functions as a layer inhibiting mixture of impurities such as hydrogen into the transistor 510 from the peripheral portion of the transistor 510.

The insulating layer 522 preferably has a single-layer structure or a stacked-layer structure using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), for example. With further miniaturization and higher integration of a transistor, a problem such as leakage current may arise because of a thinned gate insulator. When a high-k material is used for an insulator functioning as the gate insulator, a gate potential at the time of operating the transistor can be reduced while the physical thickness is kept.

For example, it is preferable that the insulating layer 521 be thermally stable. Silicon oxide and silicon oxynitride are suitable because of their thermal stability. Furthermore, combination of an insulator which is a high-k material and silicon oxide or silicon oxynitride enables formation of an insulating layer with a stacked-layer structure with thermal stability and a high dielectric constant.

FIG. 13 illustrates a three-layer stacked structure of the second gate insulator, but the second gate insulator may have a single-layer structure or a stacked-layer structure including two or more layers. In that case, the stacked layers are not necessarily formed of the same material and may be formed of different materials.

The oxide 530 including the region functioning as a channel formation region includes the oxide 530*a*, the oxide 530*b* over the oxide 530*a*, and the oxide 530*c* over the oxide 530*b*. Provision of the oxide 530*a* under the oxide 530*b* can inhibit diffusion of impurities into the oxide 530*b* from the components formed below the oxide 530*a*. Provision of the oxide 530*c* over the oxide 530*b* can inhibit diffusion of impurities from diffusing into the oxide 530*b* from the components formed above the oxide 530*c*. As the oxide 530, an oxide semiconductor that is one kind of the metal oxide described in the above embodiment can be used.

The oxide 530*c* is preferably provided in the opening in the insulating layer 580 with the insulating layer 574 positioned therebetween. When the insulating layer 574 has a barrier property, diffusion of impurities from the insulating layer 580 into the oxide 530 can be inhibited.

One of the conductive layer 540*a* and the conductive layer 540*b* functions as a source electrode, and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for the conductive layer 540*a* and the conductive layer 540*b*. In particular, a metal nitride film such as a tantalum nitride film is preferable because it has a barrier property against hydrogen or oxygen and has a high oxidation resistance.

Although a single-layer structure is illustrated in FIG. 13, a stacked-layer structure of two or more layers may be used. For example, a tantalum nitride film and a tungsten film may be stacked. Alternatively, a titanium film and an aluminum film may be stacked. In addition, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

In addition, a three-layer structure consisting of a titanium film or a titanium nitride film, an aluminum film or a copper film stacked over the titanium film or the titanium nitride film, and a titanium film or a titanium nitride film further formed thereover; and a three-layer structure consisting of a molybdenum film or a molybdenum nitride film, an aluminum film or a copper film stacked over the molybdenum film or the molybdenum nitride film, and a molybdenum film or a molybdenum nitride film further formed thereover; or the like are given. Note that a transparent conductive material containing indium oxide, tin oxide, or zinc oxide may be used.

Furthermore, a barrier layer may be provided over the conductive layer 540.

The barrier layer is preferably formed using a material having a barrier property against oxygen or hydrogen. This structure can prevent the conductive layer 540 from being oxidized at the time of forming the insulating layer 574.

For the barrier layer, for example, a metal oxide can be used. In particular, an insulating film having a barrier property against oxygen or hydrogen, such as aluminum oxide, hafnium oxide, or gallium oxide, is preferably used. Alternatively, silicon nitride deposited by a CVD method may be used.

With the use of the barrier layer, the range of choices for the materials of the conductive layer 540 can be expanded. For example, the conductive layer 540 can be formed using a material having high conductivity while having a low oxidation resistance, such as tungsten or aluminum. Furthermore, a conductor that can be easily deposited or processed can be used, for example.

The insulating layer 550 functions as a first gate insulator. The insulating layer 550 is preferably provided in the opening in the insulating layer 580 with the oxide 530c and the insulating layer 574 positioned therebetween.

With further miniaturization and higher integration of a transistor, a problem such as leakage current may arise because of a thinned gate insulator. Note that the insulating layer 550 may have a stacked-layer structure like the second gate insulator. For this reason, when an insulator serving as the gate insulator has a stacked-layer structure of a high-k material and a thermally stable material, the gate potential of the transistor in an operation state can be reduced while the physical thickness is kept. Furthermore, the stacked-layer structure can be thermally stable and have a high dielectric constant.

The conductive layer 560 functioning as a first gate electrode includes the conductive layer 560a and the conductive layer 560b over the conductive layer 560a. Like the conductive layer 505a, the conductive layer 560a is preferably formed using a conductive material having a function of inhibiting diffusion of impurities such as a hydrogen atom, a hydrogen molecule, a water molecule, and a copper atom.

Alternatively, a conductive material which has a function of inhibiting diffusion of oxygen (e.g., at least one of oxygen atoms, oxygen molecules, and the like) is preferably used.

When the conductive layer 560a has a function of preventing oxygen diffusion, the range of choices for the material of the conductive layer 560b can be expanded. That is, the conductive layer 560a inhibits the conductive layer 560b from being oxidized, thereby preventing the decrease in conductivity.

As a conductive material having a function of inhibiting diffusion of oxygen, for example, tantalum, tantalum nitride, ruthenium, ruthenium oxide, or the like is preferably used. An oxide semiconductor that can be used for the oxide 530 can be used as the conductive layer 560a. In that case, when the conductive layer 560b is formed by a sputtering method, the conductive layer 560a can have a reduced electric resistance to serve as a conductor. This can be referred to as an oxide conductor (OC) electrode.

Furthermore, the conductive layer 560b is preferably formed using a conductive material including tungsten, copper, or aluminum as its main component. Since the conductive layer 560 functions as a wiring, a conductor having high conductivity is preferably used. For example, a conductive material containing tungsten, copper, or aluminum as its main component can be used. In addition, the conductive layer 560b may have a stacked-layer structure, for example, a stacked-layer structure of titanium or titanium nitride and any of the above conductive materials.

The insulating layer 574 is disposed between the insulating layer 580 and the transistor 510. The insulating layer 574 is preferably formed using an insulating material having a function of inhibiting diffusion of oxygen and impurities such as water or hydrogen. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used.

Provision of the insulating layer 574 can inhibit impurities such as water and hydrogen contained in the insulating layer 580 from diffusing into the oxide 530b through the oxide 530c and the insulating layer 550. In addition, the conductive layer 560 can be inhibited from being oxidized due to excess oxygen contained in the insulating layer 580.

The insulating layer 580, the insulating layer 582, and the insulating layer 584 function as interlayer films.

The insulating layer 582 as well as the insulating layer 514 preferably functions as a barrier insulating film that inhibits impurities such as water or hydrogen from entering the transistor 510 from the outside.

Like the insulating layer 516, the insulating layer 580 and the insulating layer 584 preferably have lower dielectric constants than that of the insulating layer 582. The use of a material having a low dielectric constant for the interlayer film can reduce the parasitic capacitance between wirings.

The transistor 510 may be electrically connected to another structure with a plug or a wiring, such as the conductive layer 546, that is embedded in the insulating layer 580, the insulating layer 582, and the insulating layer 584.

As a material of the conductive layer 546, a conductive material such as a metal material, an alloy material, a metal nitride material, or a metal oxide material can be used in a single-layer structure or a stacked-layer structure, like the conductive layer 505. For example, a high-melting-point material having both heat resistance and conductivity, such as tungsten or molybdenum, is preferably used. Alternatively, it is preferable to use a low-resistance conductive material such as aluminum or copper. By using a low-resistance conductive material, wiring resistance can be reduced.

For example, when the conductive layer 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is ensured.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has suppressed variation in electrical characteristics, stable electrical characteristics, and has improved reliability can be provided.

<Structural Example 2 of Transistor>

Figure 14A:
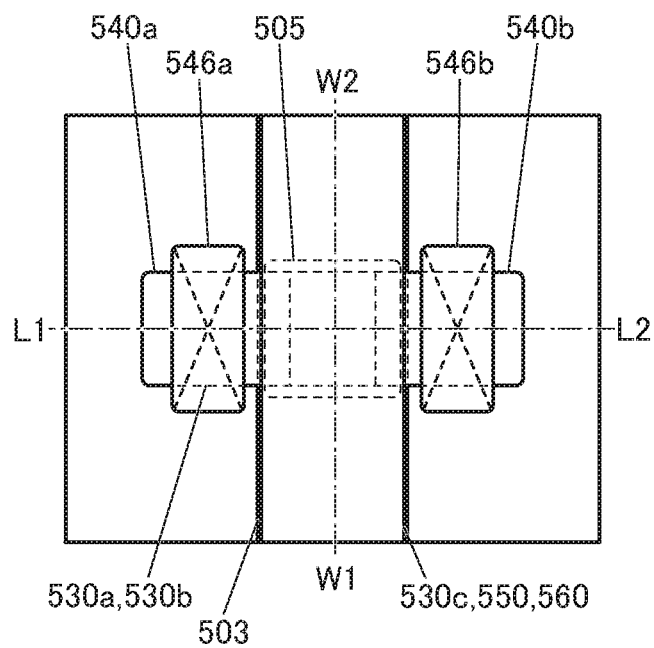
FIGS. 14A to 14C Diagrams illustrating a configuration example of a transistor.
Figure 14C:
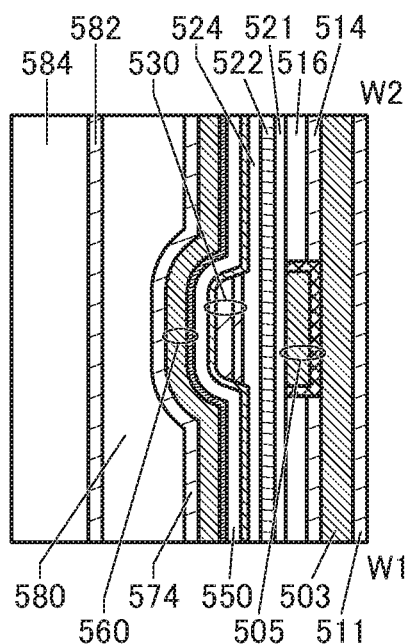
Figure 14B:
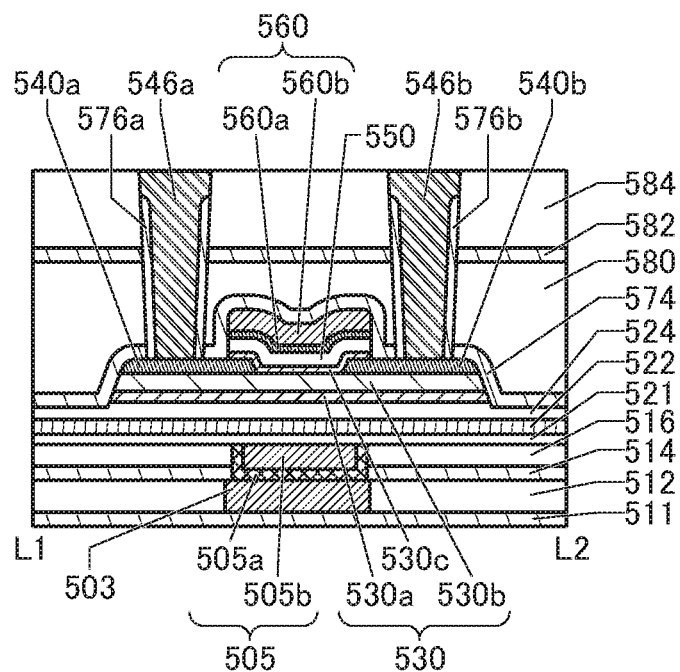

A structure example of a transistor 510 is described with reference to FIGS. 14(A), 14(B), and 14(C). FIG. 14(A) is a top view of a transistor 520. FIG. 14(B) is a cross-sectional view of a portion along the dashed-dotted line L1-L2 in FIG. 14(A). FIG. 14(C) is a cross-sectional view of a portion along the dashed-dotted line W1-W2 in FIG. 14(A). Note that for simplification of the drawing, some components are not illustrated in the top view in FIG. 14(A).

The transistor 520 is a variation example of the transistor 510. Therefore, differences from the transistor 510 are mainly described to avoid repeated description.

The transistor 520 includes a region where the conductive layer 540 (the conductive layer 540a and the conductive layer 540b) and the oxide 530c, the insulating layer 550, and the conductive layer 560 overlap with each other. With the structure, a transistor with high on-state current can be provided. Further, it is possible to provide a transistor with high controllability.

The conductive layer 560 functioning as a first gate electrode includes the conductive layer 560a and the conductive layer 560b over the conductive layer 560a. Like the conductive layer 505a, the conductive layer 560a is preferably formed using a conductive material having a function of inhibiting diffusion of impurities such as a hydrogen atom, a hydrogen molecule, a water molecule, and a copper atom.

Alternatively, a conductive material which has a function of inhibiting diffusion of oxygen (e.g., at least one of oxygen atoms, oxygen molecules, and the like) is preferably used.

Because the conductive layer 560a has a function of preventing oxygen diffusion, the range of choices for the material of the conductive layer 560b can be expanded. That is, the provision of the conductive layer 560a inhibits oxidation of the conductive layer 560b, thereby preventing the decrease in conductivity.

The insulating layer 574 is preferably provided to cover the top surface and the side surface of the conductive layer 560, the side surface of the insulating layer 550, and the side surface of the oxide 530c. Note that the insulating layer 574 is preferably formed using an insulating material having a function of inhibiting impurities such as water or hydrogen and diffusion of oxygen. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used.

The insulating layer 574 can inhibit oxidation of the conductive layer 560. Moreover, the insulating layer 574 can inhibit diffusion of impurities such as water and hydrogen contained in the insulating layer 580 into the transistor 520.

An insulating layer 576 (an insulating layer 576a and an insulating layer 576b) having a barrier property may be disposed between the conductive layer 546 and the insulating layer 580. Providing the insulating layer 576 can inhibit oxygen in the insulating layer 580 from reacting with the conductive layer 546 and oxidizing the conductive layer 546.

Furthermore, with the use of the insulating layer 576 having a barrier property, the range of choices for the materials of the conductor used as the plug or the wiring can be expanded. The use of a metal material having high conductivity while having an oxygen absorbing property for the conductive layer 546, for example, can provide a semiconductor device with low power consumption. Specifically, it is possible to use a material having high conductivity while having a low oxidation resistance, such as tungsten or aluminum. Furthermore, a conductor that can be easily deposited or processed can be used, for example.

<Structural Example 3 of Transistor>

Figure 15A:
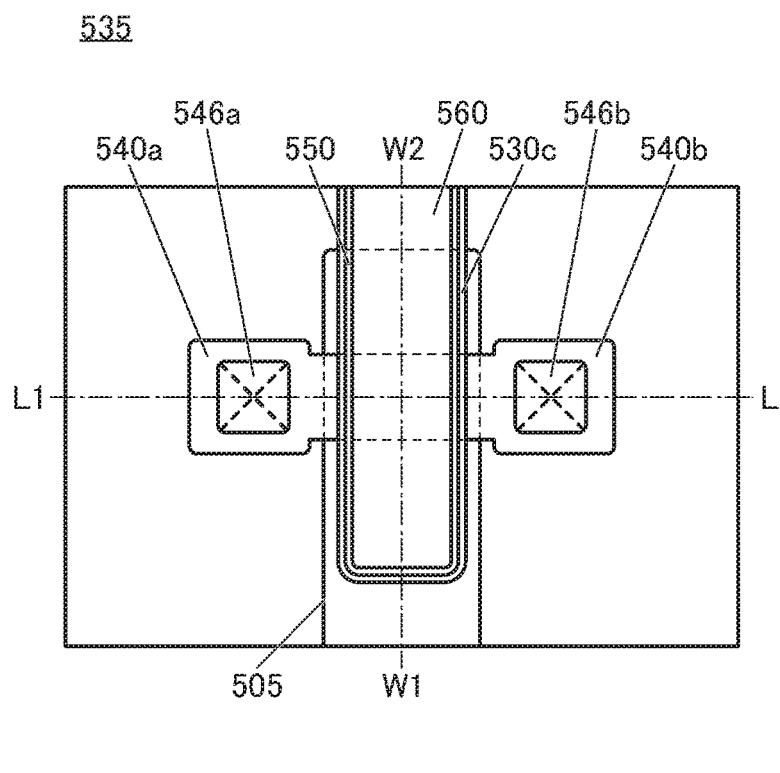
FIGS. 15A to 15C Diagrams illustrating a configuration example of a transistor.
Figure 15C:
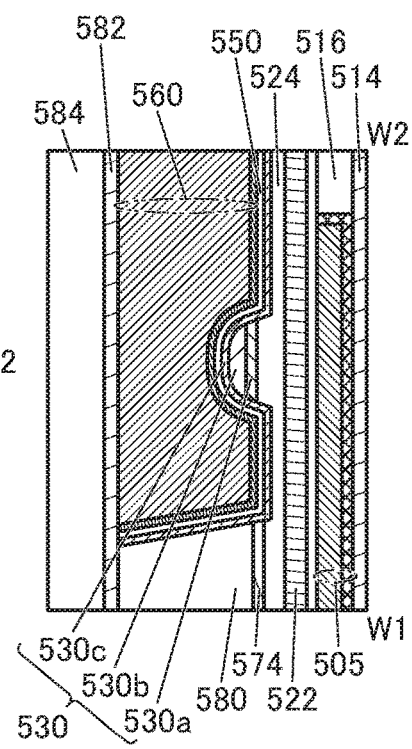
Figure 15B:
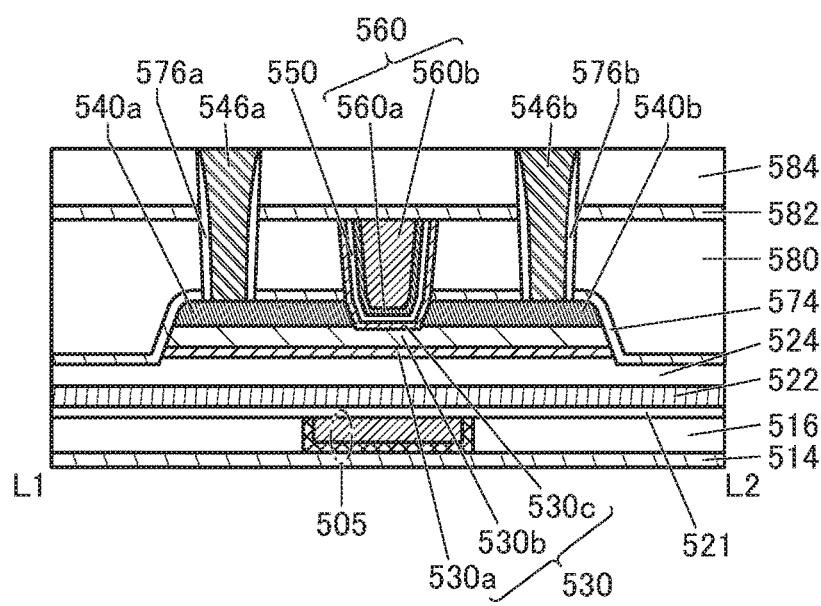

A structure example of a transistor 535 is described with reference to FIGS. 15(A), 15(B), and 15(C). FIG. 15(A) is a top view of the transistor 535. FIG. 15(B) is a cross-sectional view of a portion indicated by the dashed-dotted line L1-L2 in FIG. 15(A). FIG. 15(C) is a cross-sectional view of a portion indicated by the dashed-dotted line W1-W2 in FIG. 15(A). Note that for simplification of the drawing, some components in the top view in FIG. 15(A) are not illustrated.

The transistor 535 is a variation example of the transistor 510. Therefore, differences from the transistor 510 are mainly described to avoid repeated description.

In the transistor 510, a part of the insulating layer 574 is provided in the opening provided in the insulating layer 580 to cover the side surface of the conductive layer 560. On the other hand, in the transistor 535, parts of the insulating layer 580 and the insulating layer 574 are removed to form an opening.

The insulating layer 576 (the insulating layer 576a and the insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

When an oxide semiconductor is used as the oxide 530, the oxide 530 preferably has a stacked-layer structure of oxides that differ in the atomic ratio of metal atoms. Specifically, the atomic ratio of the element M to constituent elements in the metal oxide used as the oxide 530a is preferably greater than the atomic ratio of the element M to constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Moreover, the atomic ratio of In to the element M in the metal oxide used as the oxide 530b is preferably greater than the atomic ratio of In to the element M in the metal oxide used as the oxide 530a. As the oxide 530c, a metal oxide that can be used as the oxide 530a or the oxide 530b can be used.

The oxide 530a, the oxide 530b, and the oxide 530c preferably have crystallinity, and in particular, CAAC-OS is preferably used. An oxide having crystallinity, such as a CAAC-OS, has a dense structure with small amounts of impurities and defects (e.g., oxygen vacancies) and high crystallinity. This inhibits oxygen extraction from the oxide 530b by the source electrode or the drain electrode. This reduces oxygen extraction from the oxide 530b even when heat treatment is performed; hence, the transistor 535 is stable against high temperatures in the manufacturing process (so-called thermal budget).

Note that one or both of the oxide 530a and the oxide 530c may be omitted. The oxide 530 may be a single layer of the oxide 530b. In the case where the oxide 530 has a stacked-layer structure of the oxide 530a, the oxide 530b, and the oxide 530c, energies of the conduction band minima of the oxide 530a and the oxide 530c are preferably higher than energy of the conduction band minimum of the oxide 530b. In other words, the electron affinities of the oxide 530a and the oxide 530c are preferably smaller than the electron affinity of the oxide 530b. In that case, the oxide 530c is preferably formed using a metal oxide that can be used as the oxide 530a. Specifically, the atomic ratio of the element M to constituent elements in the metal oxide used as the oxide 530c is preferably greater than the atomic ratio of the element M to constituent elements in the metal oxide used as the oxide 530b. Moreover, the atomic ratio of the element M to In in the metal oxide used as the oxide 530c is preferably greater than the atomic ratio of the element M to In in the metal oxide used as the oxide 530b. Moreover, the atomic ratio of In to the element M in the metal oxide used as the oxide 530b is preferably greater than the atomic ratio of In to the element M in the metal oxide used as the oxide 530c.

Here, the energy level of the conduction band minimum is gradually varied at junction portions of the oxide 530a, the oxide 530b, and the oxide 530c. In other words, it can also be said that the energy level of the conduction band minimum at junction portions of the oxide 530a, the oxide 530b, and the oxide 530c is continuously varied or continuously connected. To obtain this, the density of defect states in a mixed layer formed at the interface between the oxide 530a and the oxide 530b and the interface between the oxide 530b and the oxide 530c is preferably lowered.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c. The oxide 530c may have a stacked-layer structure. For example, a stacked-layer structure of an In—Ga—Zn oxide and a Ga—Zn oxide over the In—Ga—Zn oxide, or a stacked-layer structure of an In—Ga—Zn oxide and a gallium oxide over the In—Ga—Zn oxide can be used. In other words, a stacked-layer structure of an In—Ga—Zn oxide and an oxide that does not contain In may be used as the metal oxide 530c.

Specifically, as the oxide 530a, a metal oxide having In:Ga:Zn=1:3:4 [at an atomic ratio] or In:Ga:Zn=1:1:0.5 [at an atomic ratio] may be used. As the oxide 530b, a metal oxide having In:Ga:Zn=4:2:3 [at an atomic ratio] or In:Ga:Zn=3:1:2 [at an atomic ratio] may be used. As the oxide 530c, a metal oxide having In:Ga:Zn=1:3:4 [at an atomic ratio], In:Ga:Zn=4:2:3 [at an atomic ratio], Ga:Zn=2:1 [at an atomic ratio], or Ga:Zn=2:5 [at an atomic ratio] may be used. Furthermore, as a specific example of the oxide 530c having a stacked-layer structure, a stacked-layer structure of a layer having an atomic ratio of In:Ga:Zn=4:2:3 [at an atomic ratio] and a layer having an atomic ratio of Ga:Zn=2:1 [at an atomic ratio], a stacked-layer structure of a layer having an atomic ratio of In:Ga:Zn=4:2:3 [at an atomic ratio] and a layer having an atomic ratio of Ga:Zn=2:5 [at an atomic ratio], a stacked-layer structure of a layer having an atomic ratio of In:Ga:Zn=4:2:3 [at an atomic ratio] and a gallium oxide, or the like can be given.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. This reduces the influence of interface scattering on carrier conduction, and the transistor 535 can have a high on-state current and high frequency characteristics. Note that in the case where the oxide 530c has a stacked-layer structure, it is expected that not only the density of defect state at the interface between the oxide 530b and the oxide 530c can be made low, but also the constituent element of the oxide 530c can be inhibited from being diffused into the insulating layer 550 side. More specifically, since the oxide 530c has a stacked-layer structure in which the oxide does not contain In is located in the upper side of the stacked-layer structure, In can be inhibited from being diffused into the insulating layer 550 side. Since the insulating layer 550 functions as a gate insulator, the transistor would show poor characteristics if In diffuses thereinto. Thus, the metal oxide 530c having a stacked-layer structure allows the display device to have high reliability.

The oxide 530 is preferably formed using a metal oxide functioning as an oxide semiconductor. For example, the metal oxide to be the channel formation region of the oxide 530 has a band gap greater than or equal to 2 eV, preferably greater than or equal to 2.5 eV. The use of a metal oxide having a wide band gap can reduce the off-state current of the transistor. With such a transistor, a semiconductor device with low power consumption can be provided.

This embodiment can be implemented in combination with any of the structures described in the other embodiments and the like, as appropriate.

Embodiment 5

This embodiment shows examples of an electronic component and an electronic device that incorporate the memory and the like device described in the above embodiments.

<Electronic Component>

First, examples of an electronic component incorporating the memory device 300 are described with reference to FIGS. 16(A) and 16(B).

Figure 16A:
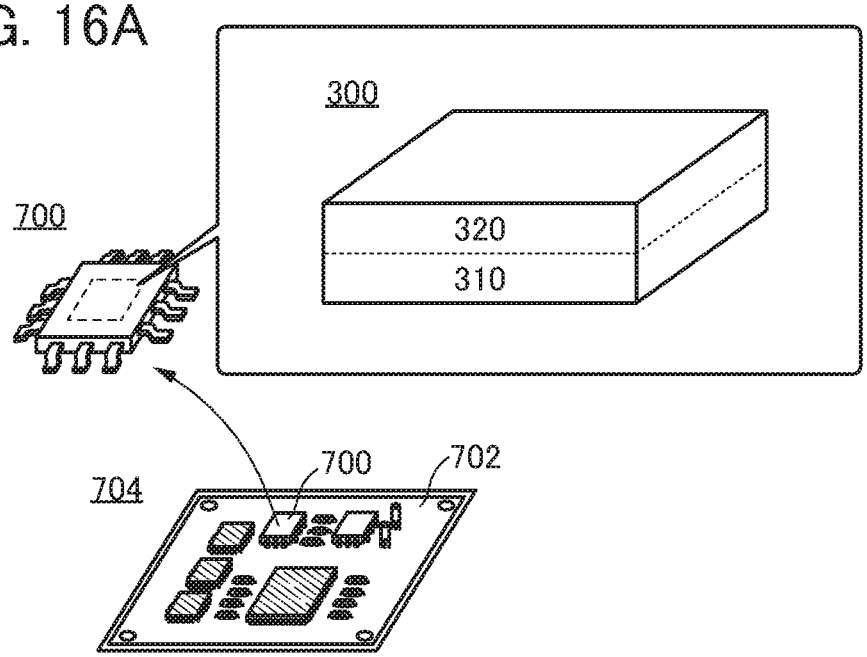
FIGS. 16A and 16B Diagrams illustrating examples of electronic devices.

FIG. 16(A) is a perspective view of an electronic component 700 and a substrate (mounting board 704) on which the electronic component 700 is mounted. The electronic component 700 illustrated in FIG. 16(A) is an IC chip including a lead and a circuit portion. The electronic component 700 is mounted on a printed circuit board 702, for example. A plurality of such IC chips are combined and electrically connected to each other on the printed circuit board 702; thus, the mounting board 704 is completed.

The memory device 300 described in the above embodiments is provided as a circuit portion of the electronic component 700. Although a quad flat package (QFP) is used as the package of the electronic component 700 in FIG. 16(A), the mode of the package is not limited thereto.

Figure 16B:
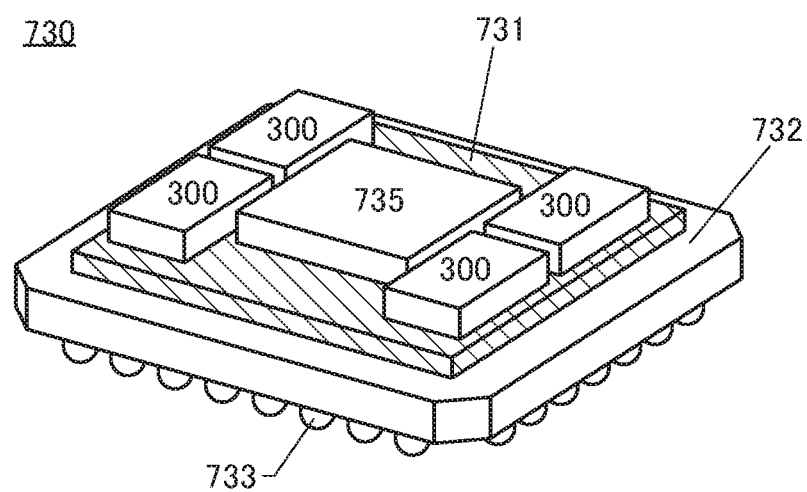

FIG. 16(B) is a perspective view of an electronic component 730. The electronic component 730 is an example of a system in package (SiP) or a multi-chip module (MCM). In the electronic component 730, an interposer 731 is provided over a package substrate 732 (printed circuit board) and a semiconductor device 735 and a plurality of memory devices 300 are provided over the interposer 731.

The electronic component 730 using the memory devices 300 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided with a single-layer structure or a multilayer structure. The interposer 731 has a function of electrically connecting an integrated circuit provided on the interposer 731 to an electrode provided on the package substrate 732. Accordingly, the interposer is sometimes referred to as a "redistribution substrate" or an "intermediate substrate". In addition, a through electrode may be provided in the interposer 731 to be used for electrically connecting the integrated circuit and the package substrate 732 in some cases. In the case of using a silicon interposer, a through-silicon via (TSV) can also be used as the through electrode.

A silicon interposer is preferably used as the interposer 731. The silicon interposer can be manufactured at lower cost than an integrated circuit because the silicon interposer does not need to be provided with an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, formation of minute and high-density wirings is required for an interposer on which HBM is mounted. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided on the silicon interposer less likely occurs. It is particularly preferable to use a silicon interposer for a 2.5 D package (2.5 dimensional mounting) in which a plurality of integrated circuits are arranged side by side on the interposer.

A heat sink (radiator plate) may be provided to overlap with the electronic component 730. In the case where the heat sink is provided, the heights of integrated circuits provided on the interposer 731 are preferably equal. In the electronic component 730 illustrated in this embodiment, the heights of the memory device 300 and the semiconductor device 735 are preferably equal, for example.

An electrode 733 may be provided on the bottom portion of the package substrate 732 to mount the electronic component 730 on another substrate. FIG. 16(B) illustrates an example in which the electrode 733 is formed of a solder ball. Solder balls are provided in a matrix on the bottom portion of the package substrate 732, whereby ball grid array (BGA) mounting can be achieved. Alternatively, the electrode 733 may be formed of a conductive pin. When conductive pins are provided in a matrix on the bottom portion of the package substrate 732, pin grid array (PGA) mounting can be achieved.

The electronic component 730 can be mounted on another substrate in various manners, not limited to the BGA and the PGA. For example, a mounting method such as a staggered pin grid array (SPGA), a land grid array (LGA), a quad flat package (QFP), a quad flat J-leaded package (QFJ), or a quad flat non-leaded package (QFN) can be used.

<Electronic Device>

Figure 17:
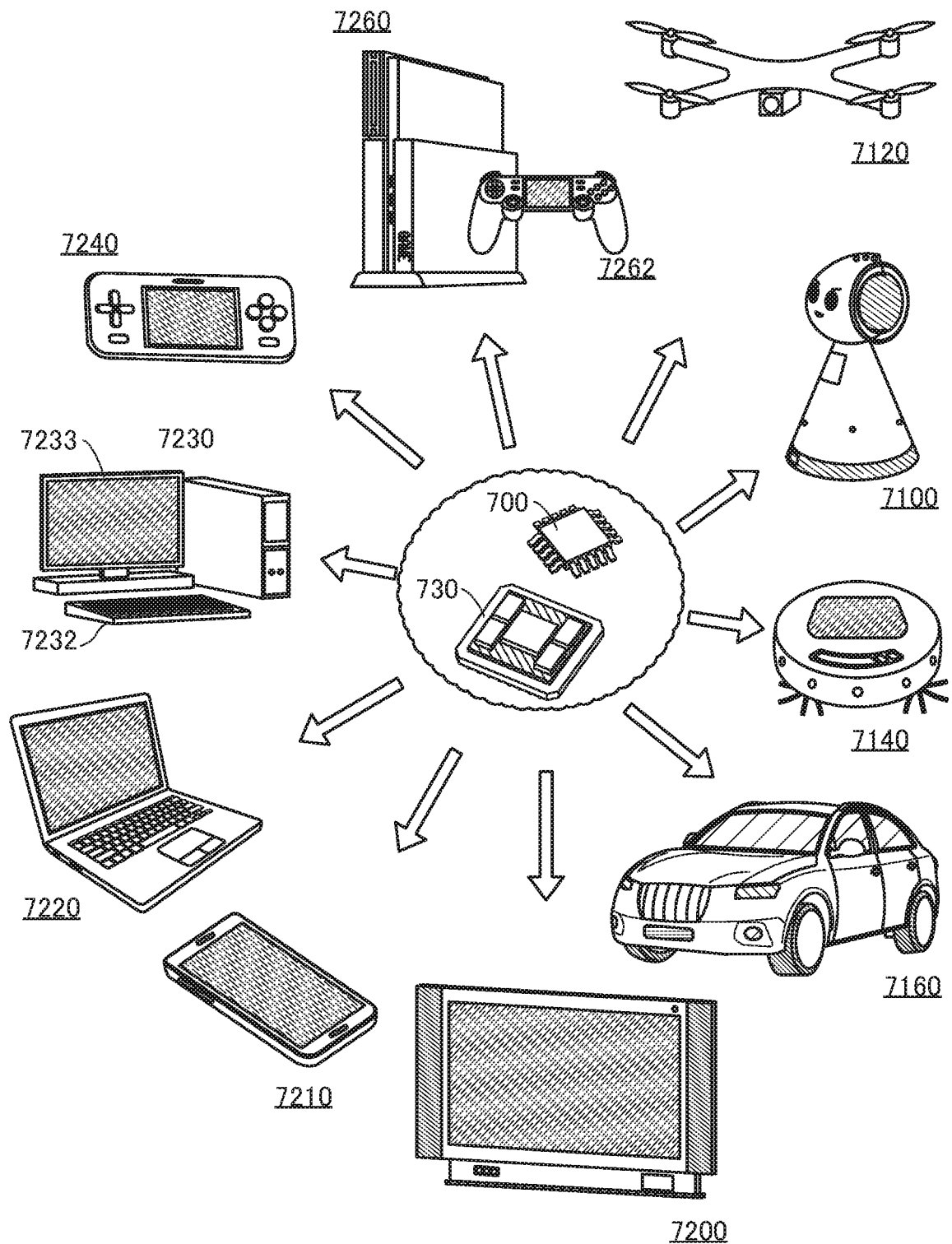
FIG. 17A diagram illustrating examples of electronic devices.

Next, examples of an electronic device including the above electronic components are described with reference to FIG. 17.

A robot 7100 is equipped with an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling such peripheral devices. The electronic component 700 has a function of storing data acquired by the sensor, for example.

The microphone has a function of detecting audio signals such as the user's voice and an environmental sound. The speaker has a function of outputting audio signals such as voice and a warning beep. The robot 7100 can analyze an audio signal that is input via the microphone and can output a necessary audio signal from the speaker. The robot 7100 can communicate with the user using the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether or not there is an obstacle in moving.

A flying object 7120 includes a propeller, a camera, a battery, and the like and has a function of flying autonomously. The electronic component 730 has a function of controlling such peripheral devices.

For example, data of an image taken with the camera is stored in the electronic component 700. The electronic component 730 can analyze the image data to sense whether or not there is an obstacle in moving. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 is self-propelled, detects dust, and sucks up the dust through the inlet provided on the bottom surface.

For example, the electronic component 730 can analyze an image taken by the cameras, to determine whether or not there is an obstacle such as a wall, furniture, or a step. In the case where an object such as a wiring that is likely to be caught in the brush is detected by analyzing an image, the rotation of the brush can be stopped.

An automobile 7160 includes an engine, tires, a brake, a steering gear, a camera, and the like. For example, the electronic component 730 performs control for optimizing the running state of the automobile 7160 in accordance with data such as navigation information, speed, the state of the engine, the gearshift state, or the frequency of use of the brake. For example, image data taken with a camera is stored in the electronic component 700.

The electronic component 700 and/or the electronic component 730 can be incorporated in a television receiving (TV) device 7200, a smartphone 7210, personal computers (PCs) 7220 and 7230, a game console 7240 and a game console 7260, and the like.

For example, the electronic component 730 incorporated in the TV device 7200 can function as an image processing engine. The electronic component 730 performs, for example, image processing such as noise removing and resolution up-conversion.

The smartphone 7210 is an example of a portable information terminal. The smartphone 7210 includes a microphone, a camera, a speaker, various kinds of sensors, and a display portion. The electronic component 730 controls such peripheral devices.

The PC 7220 and the PC 7230 are respectively examples of a notebook PC and a desktop PC. To the PC 7230, a keyboard 7232 and a monitor device 7233 can be wiredly or wirelessly connected. The game console 7240 is an example of a portable game console. The game console 7260 is an example of a stationary game console. To the game console 7260, a controller 7262 is wiredly or wirelessly connected. The electronic component 700 and/or the electronic component 730 can also be incorporated in the controller 7262.

This embodiment can be implemented in combination with any of the structures described in the other embodiments and the like, as appropriate.

Embodiment 6

In this embodiment, application examples of a memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. The semiconductor device described in the above embodiment is used for various kinds of removable memory devices such as memory cards (e.g., SD cards), USB memories, and solid state drives (SSD). FIG. 18 schematically illustrate some structure examples of removable storage devices. For example, the semiconductor device described in the above embodiment is processed into a packaged memory chip and used in a variety of storage devices and removable memories.

Figure 18A:
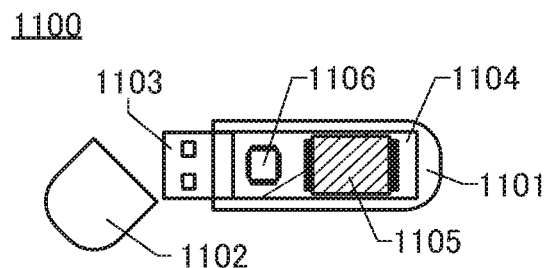
FIGS. 18A to 18E Diagrams illustrating application examples of memory devices.

FIG. 18(A) is a schematic diagram of a USB memory. A USB memory 1100 includes a housing 1101, a cap 1102, a USB connector 1103, and a substrate 1104. The substrate 1104 is stored in the housing 1101. A memory chip 1105 and a controller chip 1106 are attached to the substrate 1104, for example. The semiconductor device described in the above embodiment can be incorporated in the memory chip 1105 or the like on the substrate 1104.

Figure 18B:
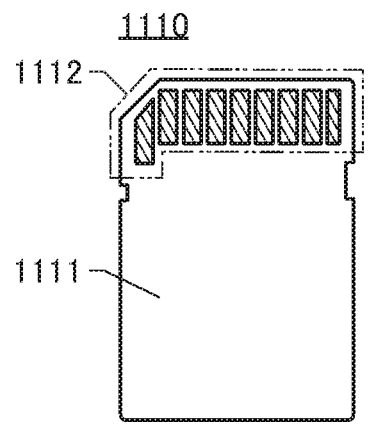
Figure 18C:
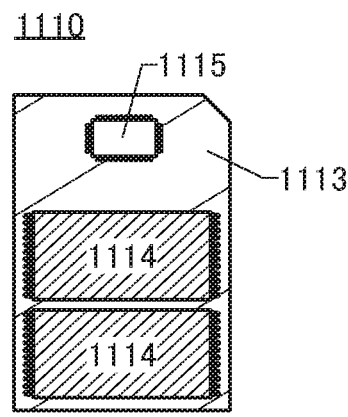

FIG. 18(B) is a schematic external diagram of an SD card, and FIG. 18(C) is a schematic diagram illustrating the internal structure of the SD card. An SD card 1110 includes a housing 1111, a connector 1112, and a substrate 1113. The substrate 1113 is stored in the housing 1111. A memory chip 1114 and a controller chip 1115 are attached to the substrate 1113, for example. The memory chip 1114 provided on the rear side of the substrate 1113 increases the capacity of the SD card 1110. In addition, a wireless chip with a wireless communication function may be provided on the substrate 1113. This enables data reading and writing of the memory chip 1114 by wireless communication between a host device and the SD card 1110. The semiconductor device described in the above embodiment can be incorporated in the memory chip 1114 or the like on the substrate 1113.

Figure 18D:
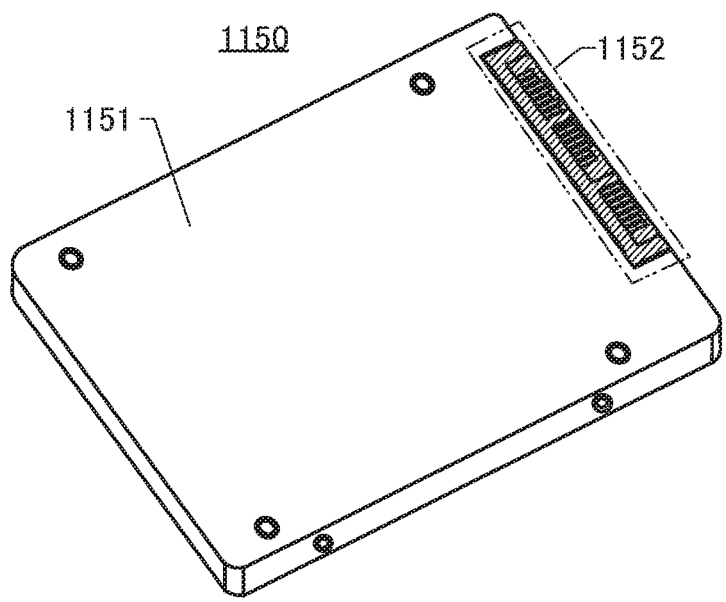
Figure 18E:
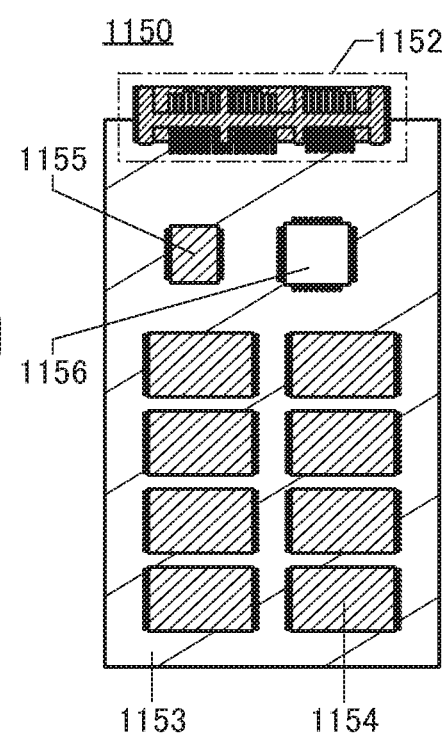

FIG. 18(D) is a schematic external diagram of an SSD, and FIG. 18(E) is a schematic diagram illustrating the internal structure of the SSD. An SSD 1150 includes a housing 1151, a connector 1152, and a substrate 1153. The substrate 1153 is stored in the housing 1151. A memory chip 1154, a memory chip 1155, and a controller chip 1156 are attached to the substrate 1153, for example. The memory chip 1155 is a work memory for the controller chip 1156, and a DOSRAM chip may be used, for example. The memory chip 1154 provided also on the rear side of the substrate 1153 increases the capacity of the SSD 1150. The semiconductor device described in the above embodiment can be incorporated in the memory chip 1154 or the like on the substrate 1153.

This embodiment can be implemented in combination with any of the structures described in the other embodiments and the like, as appropriate.

REFERENCE NUMERALS

100: semiconductor device, 110: voltage generation circuit, 120: voltage holding circuit, 130: temperature detection circuit, 131: temperature sensor, 132: analog-digital converter circuit, 140: voltage control circuit, 145: logic circuit, 146: voltage generation circuit.

The invention claimed is:

1. A semiconductor device comprising:
   a voltage generation circuit;
   a voltage holding circuit comprising a transistor;
   a temperature detection circuit;
   a voltage control circuit; and
   an output terminal,
   wherein:
      the voltage generation circuit includes a charge pump circuit configured to supply a negative potential to the transistor;
      the voltage generation circuit comprises a plurality of transistors and a plurality of capacitors;
      the voltage generation circuit is electrically connected to one of a source and a drain of the transistor;
      the voltage holding circuit is configured to supply a first voltage to the output terminal and hold a voltage of the output terminal;
      the other of the source and the drain of the transistor is electrically connected to the output terminal through a first node,
      the temperature detection circuit is configured to obtain temperature information and supply a digital signal corresponding to the temperature information to the voltage control circuit;
      the temperature detection circuit comprises a temperature sensor and an analog-digital converter circuit;
      the voltage control circuit is configured to output a second voltage corresponding to the digital signal;
      the voltage control circuit comprises a logic circuit, a plurality of buffers, and a plurality of capacitors;
      the voltage control circuit is electrically connected to the first node; and
      the voltage of the output terminal is a total voltage of the first voltage and the second voltage.

2. The semiconductor device according to claim 1, wherein the output terminal is electrically connected to a back gate of a another transistor.

3. The semiconductor device according to claim 2, wherein a semiconductor layer of the another transistor includes an oxide semiconductor.

4. The semiconductor device according to claim 1, wherein the plurality of capacitors are each electrically connected to the first node.

5. The semiconductor device according to claim 4, wherein the plurality of capacitors each have a different capacitance value.

6. The semiconductor device according to claim 1, wherein the negative potential is electrically isolated from the digital signal.

7. A semiconductor device comprising:
a voltage generation circuit;
a voltage holding circuit comprising a transistor;
a temperature detection circuit;
a voltage control circuit; and
an output terminal,
wherein:
the voltage generation circuit includes a charge pump circuit configured to supply a negative potential to the transistor;
the voltage generation circuit comprises a plurality of transistors and a plurality of capacitors;
the voltage generation circuit is electrically connected to one of a source and a drain of the transistor;
the voltage holding circuit is configured to supply a first voltage to the output terminal and hold a voltage of the output terminal;
the other of the source and the drain of the transistor is electrically connected to the output terminal through a first node,
the temperature detection circuit is configured to obtain temperature information and supply a digital signal corresponding to the temperature information to the voltage control circuit;
the temperature detection circuit comprises a temperature sensor and an analog-digital converter circuit;
the voltage control circuit is configured to output a second voltage corresponding to the digital signal;
the voltage control circuit comprises a logic circuit, a plurality of buffers, and a plurality of capacitors;
the voltage control circuit is electrically connected to the first node;
the voltage of the output terminal is a total voltage of the first voltage and the second voltage;
the voltage control circuit comprises a first capacitor, a second capacitor, and a third capacitor;
each of the first capacitor, the second capacitor, and the third capacitor is electrically connected to the first node,
a capacitance value of the second capacitor is twice a capacitance value of the first capacitor, and
a capacitance value of the third capacitor is four times the capacitance value of the first capacitor.

8. The semiconductor device according to claim 7, wherein the output terminal is electrically connected to a back gate of a another transistor, and
wherein a semiconductor layer of the another transistor includes an oxide semiconductor.

9. The semiconductor device according to claim 7, wherein the negative potential is electrically isolated from the digital signal.

* * * * *